United States Patent
Yamazaki et al.

(10) Patent No.: US 7,800,099 B2
(45) Date of Patent: Sep. 21, 2010

(54) LIGHT EMITTING DEVICE, ELECTRONIC EQUIPMENT, AND ORGANIC POLARIZING FILM

(75) Inventors: Shunepi Yamazaki, Tokyo (JP); Toru Takayama, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 59 days.

(21) Appl. No.: 11/203,406

(22) Filed: Aug. 15, 2005

(65) Prior Publication Data

US 2006/0055847 A1   Mar. 16, 2006

Related U.S. Application Data

(62) Division of application No. 10/260,398, filed on Oct. 1, 2002, now Pat. No. 7,005,671.

(30) Foreign Application Priority Data

Oct. 1, 2001   (JP) .............................. 2001-305862

(51) Int. Cl.
*H01L 35/24* (2006.01)
(52) U.S. Cl. .............................. 257/40; 257/83; 257/84; 257/93; 257/499; 257/E51.001
(58) Field of Classification Search .................. 257/40, 257/83, 84, 93, 499; 438/99
See application file for complete search history.

(56) References Cited

U.S. PATENT DOCUMENTS

| | | |
|---|---|---|
| 3,939,834 A | 2/1976 | McMahon |
| 4,489,481 A | 12/1984 | Jones |
| 4,643,950 A | 2/1987 | Ogura et al. |
| 4,911,814 A | 3/1990 | Matsuoka et al. |

(Continued)

FOREIGN PATENT DOCUMENTS

EP   207216 A2   1/1987

(Continued)

OTHER PUBLICATIONS

Tsutsui et al., *Japanese Journal of Applied Physics* "High Quantum Efficiency Organic Light-Emitting Devices With Iridium-Complex as a Triplet Emissive Center", vol. 38/Part 2, No. 12B, pp. L1502-L1504 (Dec. 15, 1999).

(Continued)

*Primary Examiner*—Wai-Sing Louie
(74) *Attorney, Agent, or Firm*—Nixon Peabody LLP; Jeffrey L. Costellia

(57) ABSTRACT

A light emitting device capable of reducing degradation caused by dispersion of impurities such as moisture, oxygen, an alkaline metal, and an alkaline earth metal is provided. Specifically, a flexible light emitting device with an OLED formed on a plastic substrate is provided. In a light emitting device using a substrate, a circular polarizing plate has a single layer or two or more layers of barrier films formed of a compound or compounds selected from $AlN_xO_y$, $Al_xN_y$, and $Al_2O_3$, which is (are) capable of preventing oxygen and moisture from seeping into an organic light emitting layer of an OLED as well as preventing an alkaline metal, an alkaline earth metal, and other impurities from penetrating an active layer of a TFT.

48 Claims, 12 Drawing Sheets

U.S. PATENT DOCUMENTS

| | | | |
|---|---|---|---|
| 5,085,926 A | 2/1992 | Iida et al. | |
| 5,107,175 A | 4/1992 | Hirano et al. | |
| 5,124,204 A | 6/1992 | Yamashita et al. | |
| 5,189,405 A | 2/1993 | Yamashita et al. | |
| 5,326,968 A | 7/1994 | Johnson et al. | |
| 5,455,625 A | 10/1995 | Englander | |
| 5,583,369 A | 12/1996 | Yamazaki et al. | |
| 5,605,847 A * | 2/1997 | Zhang | 438/164 |
| 5,627,364 A | 5/1997 | Codama et al. | |
| 5,668,524 A | 9/1997 | Aida et al. | |
| 5,674,304 A | 10/1997 | Fukada et al. | |
| 5,681,759 A | 10/1997 | Zhang | |
| 5,686,360 A | 11/1997 | Harvey, III et al. | |
| 5,693,956 A | 12/1997 | Shi et al. | |
| 5,696,386 A | 12/1997 | Yamazaki | |
| 5,757,126 A | 5/1998 | Harvey, III et al. | |
| 5,771,562 A | 6/1998 | Harvey, III et al. | |
| 5,777,543 A | 7/1998 | Aida et al. | |
| 5,811,177 A | 9/1998 | Shi et al. | |
| 5,821,138 A | 10/1998 | Yamazaki et al. | |
| 5,946,561 A | 8/1999 | Yamazaki et al. | |
| 5,952,778 A | 9/1999 | Haskal et al. | |
| 5,973,449 A | 10/1999 | Nakamura et al. | |
| 6,083,628 A | 7/2000 | Yializis | |
| 6,106,983 A | 8/2000 | Burke | |
| 6,108,059 A * | 8/2000 | Yang | 349/65 |
| 6,127,199 A | 10/2000 | Inoue et al. | |
| 6,144,108 A | 11/2000 | Ohizumi et al. | |
| 6,146,225 A | 11/2000 | Sheats et al. | |
| 6,150,187 A | 11/2000 | Zyung et al. | |
| 6,165,598 A | 12/2000 | Nelson | |
| 6,198,217 B1 | 3/2001 | Suzuki et al. | |
| 6,198,220 B1 | 3/2001 | Jones et al. | |
| 6,268,631 B1 | 7/2001 | Fukada et al. | |
| 6,268,695 B1 | 7/2001 | Affinito | |
| 6,287,955 B1 | 9/2001 | Wang et al. | |
| 6,310,672 B1 | 10/2001 | Koike et al. | |
| 6,329,087 B1 * | 12/2001 | Okamoto | 428/813 |
| 6,372,608 B1 | 4/2002 | Shimoda et al. | |
| 6,376,105 B1 | 4/2002 | Jonas et al. | |
| 6,376,333 B1 | 4/2002 | Yamazaki et al. | |
| 6,413,645 B1 | 7/2002 | Graff et al. | |
| 6,449,239 B1 | 9/2002 | Uno et al. | |
| 6,475,845 B2 | 11/2002 | Kimura | |
| 6,497,598 B2 | 12/2002 | Affinito | |
| 6,522,067 B1 | 2/2003 | Graff et al. | |
| 6,541,294 B1 | 4/2003 | Yamazaki et al. | |
| 6,548,912 B1 | 4/2003 | Graff et al. | |
| 6,549,335 B1 * | 4/2003 | Trapani et al. | 359/490 |
| 6,570,325 B2 | 5/2003 | Graff et al. | |
| 6,570,709 B2 | 5/2003 | Katayama et al. | |
| 6,573,652 B1 | 6/2003 | Graff et al. | |
| 6,586,772 B2 | 7/2003 | Bijlsma | |
| 6,623,861 B2 | 9/2003 | Martin et al. | |
| 6,639,360 B2 | 10/2003 | Roberts et al. | |
| 6,720,203 B2 | 4/2004 | Carcia et al. | |
| 6,768,257 B1 * | 7/2004 | Yamada et al. | 313/504 |
| 6,771,677 B2 | 8/2004 | Furukawa et al. | |
| 6,923,702 B2 | 8/2005 | Graff et al. | |
| 6,943,369 B2 * | 9/2005 | Hayashi | 257/40 |
| 6,960,877 B1 | 11/2005 | Heeks et al. | |
| 6,962,671 B2 | 11/2005 | Martin et al. | |
| 7,005,798 B2 | 2/2006 | Carcia et al. | |
| 2001/0000680 A1 | 5/2001 | Matono et al. | |
| 2001/0001485 A1 | 5/2001 | Bao et al. | |
| 2001/0011726 A1 | 8/2001 | Hayashi et al. | |
| 2001/0026835 A1 | 10/2001 | Tanaka | |
| 2001/0030323 A1 | 10/2001 | Ikeda | |
| 2001/0040645 A1 | 11/2001 | Yamazaki | |
| 2002/0017643 A1 | 2/2002 | Koyama | |
| 2002/0047120 A1 | 4/2002 | Inukai | |
| 2002/0125817 A1 | 9/2002 | Yamazaki et al. | |
| 2002/0150775 A1 | 10/2002 | Ishikawa et al. | |
| 2003/0027369 A1 | 2/2003 | Yamazaki | |
| 2003/0057422 A1 | 3/2003 | Yamazaki et al. | |
| 2003/0091871 A1 | 5/2003 | Yamazaki et al. | |
| 2003/0155573 A1 | 8/2003 | Yamazaki et al. | |
| 2003/0206332 A1 | 11/2003 | Yamazaki et al. | |
| 2003/0207488 A1 | 11/2003 | Carcia et al. | |
| 2005/0197031 A1 | 9/2005 | Yamazaki et al. | |
| 2005/0206313 A1 | 9/2005 | Yamazaki et al. | |
| 2005/0208863 A1 | 9/2005 | Yamazaki et al. | |

FOREIGN PATENT DOCUMENTS

| | | |
|---|---|---|
| EP | 773166 A1 | 5/1997 |
| EP | 1 058 314 A2 | 12/2000 |
| EP | 1 524 708 A2 | 4/2005 |
| JP | 59-121876 | 7/1984 |
| JP | 61-256663 | 11/1986 |
| JP | 64-035961 | 2/1989 |
| JP | 02-070059 | 3/1990 |
| JP | 03-106027 | 5/1991 |
| JP | 04-192466 | 7/1992 |
| JP | 05-203809 | 8/1993 |
| JP | 05-315630 | 11/1993 |
| JP | 07-169567 | 7/1995 |
| JP | 08-053116 | 2/1996 |
| JP | 08-062590 | 3/1996 |
| JP | 08-068990 | 3/1996 |
| JP | 08-286180 | 11/1996 |
| JP | 08-288522 | 11/1996 |
| JP | 09-127885 A | 5/1997 |
| JP | 10-125929 A | 5/1998 |
| JP | 10-125930 A | 5/1998 |
| JP | 10-125931 A | 5/1998 |
| JP | 10-142422 | 5/1998 |
| JP | 11-077885 | 3/1999 |
| JP | 2000-173027 A | 6/2000 |
| JP | 2000-275622 | 10/2000 |
| JP | 2001-052864 | 2/2001 |
| JP | 3145574 | 3/2001 |
| JP | 2001-118674 | 4/2001 |
| JP | 3152857 | 4/2001 |
| JP | 3176219 | 6/2001 |
| JP | 3181006 | 7/2001 |
| JP | 2001-237065 | 8/2001 |
| JP | 2001-272923 | 10/2001 |
| JP | 2002-082633 | 3/2002 |
| JP | 3273110 | 4/2002 |
| JP | 2002-532847 | 10/2002 |
| JP | 2002-532850 | 10/2002 |
| JP | 2002-543563 | 12/2002 |
| WO | WO 00/36661 | 6/2000 |
| WO | WO 00/36665 | 6/2000 |
| WO | WO 00/65670 | 11/2000 |
| WO | WO 01/82389 A1 | 11/2001 |
| WO | WO 01/89006 A1 | 11/2001 |
| WO | WO 02/083411 A1 | 10/2002 |

OTHER PUBLICATIONS

Baldo et al., *Applied Physics Letters* "Very High-Efficiency Green Organic Light-Emitting Devices Based on Electrophosphorescence", vol. 75, No. 1, pp. 4-6, (Jul. 5, 1999).

Baldo et al., *Nature* "Highly Efficient Phosphorescent Emission From Organic Electroluminescent Devices", vol. 395, pp. 151-154, (Sep. 10, 1998).

* cited by examiner

LIGHT EMITTING DEVICE, ELECTRONIC EQUIPMENT, AND ORGANIC POLARIZING FILM

BACKGROUND OF THE INVENTION

1. Field of the Invention

The present invention relates to a light emitting device, especially, a light emitting device and an electronic equipment having an organic light emitting diode (OLED) formed on a plastic substrate. Further, the present invention relates to an OLED module wherein ICs including a controller and the like are mounted on the OLED panel. In this specification, the light emitting device is a general term for the OLED panel and the OLED module.

2. Description of the Related Art

In recent years, a technology constituting a thin film transistor (TFT) using a semiconductor thin film (in the range from about a few to a few hundreds nm in thickness) formed on the substrate having an insulating surface has drawn attention. A thin film transistor is widely applied to electronic devices such as an IC, an electro-optic device or the like, and particularly, there is an urgent need to be developed as a switching element for an image display device.

Although as for applications utilizing such an image display device, a variety of applications are expected, particularly, its utilization for portable apparatuses has drawn the attention. At present, although many glass substrates and quartz substrates are utilized, there are defaults of being easily cracked and heavy. Moreover, the glass substrates and quartz substrates are difficult to be made larger in terms of conducting a mass-production, and these are not suitable for that. Therefore, the attempt that a TFT element is formed on a substrate having flexibility, representatively, on a flexible plastic film has been performed.

However, since the heat resistance of a plastic film is low, it cannot help lowering the highest temperature of the process. As a result, at present, a TFT is formed which has not so excellent electric characteristics compared with those formed on the glass substrates. Therefore, a light emitting element having a high performance by utilizing a plastic film have not been realized yet.

In these years, research of an active matrix type light emitting device (hereinafter, simply referred to as a light emitting device) having a light emitting diode as a self-luminescence type element is intensified. The light emitting device is also called as an organic EL display (OELD) or an organic light emitting diode (OLED).

The OLED has high visibility since it emits light for itself and does not need a backlight which is necessary in a liquid crystal display (LCD), and it is optimum to be made thinner, and there is no limitation about a visual field angle. Therefore, a light emitting device using the OLED is noticed as a display device taking the place of CRTs and LCDs.

In case that it becomes possible to make a light emitting device in which an organic light emitting element is formed on a substrate having flexibility such as plastic film, it is thin in thickness and of light weight and can be used for a display having a curved surface and a show window. Therefore, its application is not limited only to portable apparatuses but it has a broader range of applications.

However, a substrate comprising a plastic is generally easy to transmit moisture and oxygen through it, and deterioration of an organic light emitting layer is expedited by these staffs, and therefore, a light emitting device is particularly easy to be short-lived. Thus, in the related art, an insulating film which comprises silicon nitride and silicon oxynitride is disposed between a plastic substrate and an OLED so that mixture of moisture and oxygen in the organic light emitting layer is prevented. However, in the insulating film which comprises silicon nitride and silicon nitride oxide, it is hard to adequately prevent moisture and oxygen from being mixed in the organic light emitting layer.

In addition, a substrate such as a plastic film is generally weak against heat, and in case that temperature for forming an insulating film such as silicon nitride and silicon oxynitride is raised too much, the substrate is made to be easily transformed. Further, in case that film forming temperature is too low, film characteristic is deteriorated so that it becomes hard to adequately prevent moisture and oxygen from being mixed.

Further, in case that driven is an element which is disposed on the substrate such as the plastic film, it becomes an issue that heat is developed locally so that a part of the substrate is transformed and degenerated.

Furthermore, in case that thickness of the insulating film such as silicon nitride and silicon oxynitride is increased in order to prevent moisture and oxygen from being mixed, stress is enlarged so that it becomes easy to suffer some cracks. Moreover, in case that film thickness is increased, the film is apt to suffer some cracks when the substrate is bent. Further, when the substrate is peeled off, a layer to be peeled off is bent and the layer to be peeled off suffers some cracks.

Further, in case of a TFT, when impurities such as an alkaline metal (Li, Cs, Na etc.) and an alkaline earth metal (Ca, Mg etc.) and other metal elements are diffused in an active layer in addition to moisture and oxygen, characteristic is apt to be changed.

Furthermore, even after final products are made, in case that other impurities, for example, human sweat and impurities from connecting components, are diffused and mixed in the light emitting layer and the active layer of TFT, there is a possibility that degeneration and deterioration are expedited.

SUMMARY OF THE INVENTION

The present invention is, in light of the above problems, to provide a light emitting device which is capable of suppressing deterioration due to diffusion of impurities such as moisture, oxygen, an alkaline metal and an alkaline earth metal, and concretely, a light emitting device having the OLED which is formed on the plastic substrate.

In general, light emitting devices having OLEDs are provided with a polarizing means called a circular polarizing plate as an antireflection means for preventing background images from being reflected on the screen. A light emitting element having circular polarizing means on its light exit side is disclosed in JP 09-127885 A.

The present invention is characterized in that a circular polarizing plate, which is interposed between a light emitting element and a viewer (observer), has on its one side or each side a single layer or multilayer of a compound or compounds selected from $AlN_xO_y$, $Al_xN_y$, and $Al_2O_3$ (the layer(s) may also be called a barrier film (barrier films) below), which is (are) capable of preventing oxygen and moisture from seeping into an organic light emitting layer of an OLED as well as preventing an alkaline metal, an alkaline earth metal, and other impurities from penetrating an active layer of a TFT. Preferably, the circular polarizing plate is sandwiched between plural barrier films to prevent oxygen and moisture from seeping into an organic light emitting layer of an OLED.

In this specification, a circular polarizing plate refers to an antireflection means for preventing background images from being reflected on a screen of a light emitting device having an OLED. Specifically, a circular polarizing plate (including an elliptical polarizing plate) is a combination of a phase difference plate (λ/4 plate) or a phase difference film and a polarizing plate, or a polarizing film, or a linear polarizing film. Background images being reflected on a screen means that viewer's face, ceiling, and other surroundings are reflected on a display unit of a light emitting device due to reflection by a cathode or the like. To elaborate, a polarizing plate and a phase difference film with their polarization axes forming an angle of 45° make a circular polarizing plate. When the polarization axes of a polarizing plate and a phase difference film form an angle of 45°, light entering the polarizing plate from the outside is changed into linearly-polarized light by passing through the polarizing plate and then twisted by 45° and changed into elliptically-polarized light by the phase difference film. The elliptically-polarized light is reflected by a cathode and changed into linearly-polarized light by the phase difference film. The linearly-polarized light and the polarization axis of the polarizing plate form an angle of 90° and therefore the reflected light is absorbed by the polarizing plate. Accordingly, a phase difference film and a polarizing plate are set in a light emitting device in a manner that keeps a viewer from seeing background images reflected on the screen. As described, a light emitting device employs a circular polarizing plate to prevent light that has entered the device from the outside from exiting the device upon being reflected by a cathode. In this specification, the term circular polarizing plate includes a circular polarizing film.

The present invention is applicable to passive matrix devices and active matrix devices both, and is not limited to any particular driving method.

A structure of the present invention disclosed in this specification is a light emitting device with a light emitting element having a cathode, an organic compound layer, and an anode, the organic compound layer being in contact with the cathode, the anode being in contact with the organic compound layer, characterized in that the light emitting device is provided with a circular polarizing plate having a single layer or multilayer of $AlN_XO_Y$.

In the above structure, the light emitting device is characterized in that the circular polarizing plate has a single layer or multilayer of $AlN_XO_Y$ on one side thereof or on each side thereof. The circular polarizing plate having a single layer or multilayer of $AlN_XO_Y$ on one side thereof or on each side thereof may be used as a sealing member, a supporting member, or a cover member in order to reduce the weight of the light emitting device more.

In the above structure, the light emitting device is characterized in that the circular polarizing plate has a single layer or multilayer of $AlN_XO_Y$ on one side thereof and has a bonding member on the other side thereof. In the above structures, the light emitting device is characterized in that the circular polarizing plate is interposed between the light emitting element and a viewer (observer), and is positioned at some point along the light path that starts with emission of light from the light emitting element and ends with arrival of the light at the viewer.

In the above structures, the light emitting device is characterized in that the $AlN_XO_Y$ layer(s) contain(s) 2.5 to 47.5 atm % of nitrogen. This way the layer(s) can block moisture and oxygen and become(s) highly heat-conductive to obtain a heat radiation effect. In addition, the layer(s) can prevent an alkaline metal, an alkaline earth metal, and other impurities from penetrating an active layer of a TFT. In the above structures, the light emitting device is characterized in that the $AlN_XO_Y$ layer(s) is (are) 50 to 500 nm in thickness.

The present invention may be a light emitting device sandwiched between a pair of substrates. Accordingly, another structure of the present invention is a light emitting device with a light emitting element sandwiched between a first substrate and a second substrate, the light emitting element having a cathode, an organic compound layer, and an anode, the organic compound layer being in contact with the cathode, the anode being in contact with the organic compound layer, the device being characterized in that the first substrate or the second substrate is provided with a circular polarizing plate having a single layer or multilayer of a compound or compounds selected from $AlN_XO_Y$, $Al_XN_Y$, and $Al_2O_3$.

In the above structure, the light emitting device is characterized in that the circular polarizing plate is fixed to the first substrate or the second substrate by a bonding member.

When the circular polarizing plate having an $AlN_XO_Y$ layer, and/or an $Al_XN_Y$ layer, and/or an $Al_2O_3$ layer is provided on one of the substrates (the light exit side) and the other substrate is a plastic substrate, desirably two or more layers of barrier films composed of $AlN_XO_Y$ layers, and/or $Al_XN_Y$ layer, and/or $Al_2O_3$ layers are formed on the plastic substrate and a stress relaxing film containing a resin (hereinafter referred to as stress relaxing film) is interposed between two adjacent layers of the two or more barrier films. Then an OLED is formed on three or more layers of insulating films and sealed to complete a light emitting device.

Alternatively, the circular polarizing plate may have two or more layers of barrier films composed of $AlN_XO_Y$ layers, and/or $Al_XN_Y$ layers, and/or the $Al_2O_3$ layers and a stress relaxing film is interposed between two adjacent layers of the two or more barrier films.

The above structure, namely, a laminate of barrier films and stress relaxing films formed on the circular polarizing plate or the plastic substrate, makes the device more flexible and can prevent the device from cracking when it is bent.

With a plurality of barrier films composed of $AlN_XO_Y$ layers, and/or $Al_XN_Y$ layers, and/or $Al_2O_3$ layers layered on the circular polarizing plate or the plastic substrate, a crack in one of the barrier films is not a problem since the rest of the barrier films effectively prevent permeation of moisture, oxygen, and other impurities into the organic light emitting layer as well as penetration of an alkaline metal and like other impurities into the active layer of the TFT.

By sandwiching a stress relaxing film that is smaller in stress than a barrier film between barrier films, the entire stress can be eased. Therefore barrier films sandwiching a stress relaxing film is less likely to be cracked by stress than a single-layered barrier film even if the total thickness of the former is the same as the thickness of the latter.

The following combinations can be employed as the laminate of barrier films and stress relaxing films: an $AlN_XO_Y$ layer (a first barrier film), an organic resin layer that is in contact with the first barrier film, and an $AlN_XO_Y$ layer (a second barrier film) that is in contact with the organic resin layer; an organic resin layer (a first stress relaxing film), an $AlN_XO_Y$ layer that is in contact with the first stress relaxing film, and an organic resin layer (a second stress relaxing film) that is in contact with the $AlN_XO_Y$ layer; and an $AlN_XO_Y$ layer (a first barrier film), an organic resin layer that is in contact with the first barrier film, and an $Al_2O_3$ layer (a second barrier film) that is in contact with the organic resin layer.

The $AlN_XO_Y$ layer(s) formed on the circular polarizing plate or the plastic substrate may have a concentration gradient so that a larger amount of nitrogen is contained on the side close to the light emitting element and the nitrogen content becomes smaller as the distance from the light emitting element is increased. If a barrier film is an $AlN_XO_Y$ layer having a nitrogen concentration gradient as this, the total thickness of the barrier film can be reduced to improve the entire light transmittance.

In the present invention, if the direction in which light emitted from the light emitting element exits the device is to be chosen, it is preferred for the light to pass the substrate provided with the circular polarizing plate to be recognized by a viewer (user).

To sandwich the light emitting element between two substrates, the substrates are bonded to each other by a bonding layer. However, the bonding layer allows moisture, oxygen, and other impurities to permeate even if barrier films are formed on both substrates. Therefore, preferably a single layer or multilayer of a compound or compounds selected from $AlN_XO_Y$, $Al_XN_Y$, and $Al_2O_3$ is (are) used as a passivation film (passivation films, also called protective films) for covering the light emitting element and the light emitting element is wrapped with the barrier film(s) and the passivation film(s). In addition, the light emitting element may be covered with two or more layers of passivation films composed of $AlN_XO_Y$ layers, and/or $Al_XN_Y$ layers, and/or $Al_2O_3$ layers and a stress relaxing film containing a resin (hereinafter referred to as stress relaxing film) is interposed between two adjacent layers of the two or more passivation films. By sandwiching a stress relaxing film that is smaller in stress than a passivation film between passivation films, the entire stress can be eased.

In the above structures, the organic resin layer is characterized by being formed from a single layer or multilayer of a material that is smaller in stress than $Al_XN_Y$, for example, a material selected from polyimide, acrylic, polyamide, polyimideamide, benzocyclobutene, or an epoxy resin. In the above structures, the organic resin layer is characterized by including the bonding layer for bonding the substrates.

The $AlN_XO_Y$ layer and $Al_XN_Y$ layer in the above structures diffuse heat generated in the element to provide an effect of reducing degradation of the element as well as an effect of protecting the plastic substrate against deformation and alteration.

In the above respective structures, as long as the above mentioned plastic substrate has flexibility, it is not particularly limited, and may be a plastic substrate selected from, for example, polyethylene terephthalate (PET), polyether sulfone (PES), polyethylene naphthalate (PEN), polycarbonate (PC), nylon, polyether etherketone (PEEK), polysulfone (PSF), polyether imide (PEI), polyallylate (PAR), polybutylene terephthalate (PBT), or polyimide.

Further, another structure of the present invention is an organic polarizing film having on its film surface a single layer or multilayer of a compound or compounds selected from $AlN_XO_Y$, $Al_XN_Y$, and $Al_2O_3$.

In the above structure, the single layer or multilayer of a compound or compounds selected from $AlN_XO_Y$, $Al_XN_Y$, and $Al_2O_3$ is (are) 50 to 500 nm thick in total.

In this specification, all layers provided between a cathode and an anode of an OLED are generically defined as organic light emitting layers. Specifically, a light emitting layer, a hole injection layer, an electron injection layer, a hole transporting layer, an electron transporting layer and the like are all included in the category of organic light emitting layers. The OLED basically has a structure in which an anode, a light emitting layer and a cathode are layered in the stated order. In addition to this structure, some OLEDs have a structure including an anode, a hole injection layer, a light emitting layer and a cathode layered in the stated order, and other OLEDs have a structure including an anode, a hole injection layer, a light emitting layer, an electron transporting layer, a cathode and the like layered in the stated order.

The OLED includes: a layer containing an organic compound ((organic light emitting material) hereinafter referred to as organic light emitting layer), which generates luminescence (electroluminescence) by applying an electric field; an anode; and a cathode. The electroluminescence generated from the organic compound includes: light emission (fluorescence) caused upon return from a singlet excited state to a ground state; and light emission (phosphorescence) caused upon return from a triplet excited state to a ground state. The light emitting device of the present invention may use either one of the above-described types of light emission; alternatively, it may use both types of light emission.

DETAILED DESCRIPTION OF THE PREFERRED EMBODIMENTS

Embodiment modes of the present invention will be described below.

Embodiment Mode 1

Figure 1:
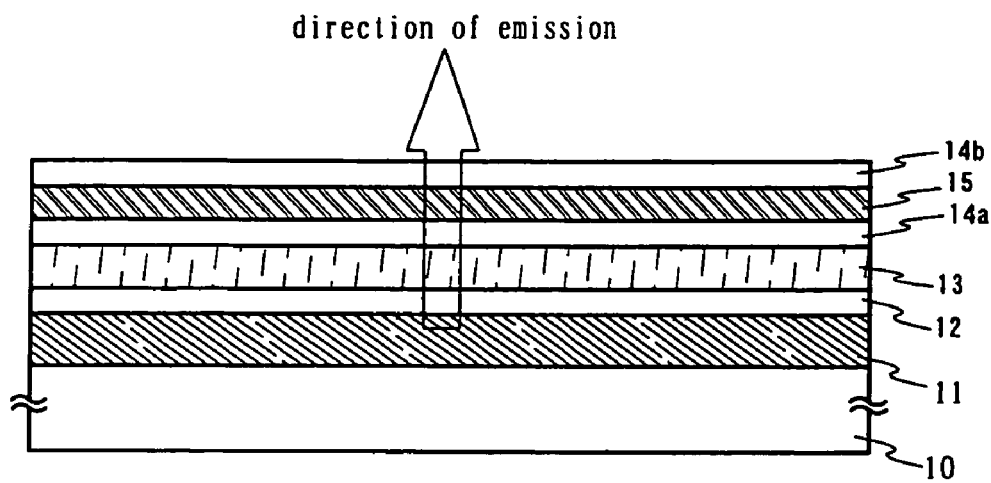
FIG. 1 is a brief sectional view for explaining a light emitting device of the present invention.

FIG. 1 is a simplified view of an example of a light emitting device according to the present invention.

First, a substrate 10 is prepared. On the substrate 10, a layer 11 including an OLED or including an OLED and a TFT is formed. No particular limitation is put on the substrate 10 and a glass substrate, a quartz substrate, a silicon substrate, a metal substrate, or a stainless steel substrate may be employed. For simplification, detailed structures of the OLED and TFT are not shown in the drawing.

Next, a protective film (also called a passivation film) is formed to cover the layer 11 including an OLED or including an OLED and a TFT. The protective film is a single layer or multilayer of a compound or compounds selected from $AlN_XO_Y$, $Al_XN_Y$, and $Al_2O_3$. Here, $AlN_XO_Y$ films are used.

Prepared next is a circular polarizing plate 15 having on one side or each side a single layer or multilayer of a compound or compounds selected from $AlN_XO_Y$, $Al_XN_Y$, and $Al_2O_3$. The circular polarizing plate 15 here has an $AlN_XO_Y$ film 14a on one side and an $AlN_XO_Y$ film 14b on the other side.

Then the substrate 10 on which the layer 11 including an OLED or including an OLED and a TFT is formed is bonded to the circular polarizing plate 15 having the $AlN_XO_Y$ film 14a on one side and the $AlN_XO_Y$ film 14b on the other side using a bonding member 13 to seal the device. The bonding member 13 is made of a material highly transmissive of light, for example, an epoxy resin.

The light emitting device shown in FIG. 1 is thus obtained. The light emitting device shown in FIG. 1 emits light in the direction indicated by the arrow in FIG. 1 and uses the circular polarizing plate 15 to prevent background images from being reflected on the screen. The present invention is not limited to the device that emits light in the direction of the arrow shown in FIG. 1 but is applicable to one that emits light in the opposite direction to the arrow direction of FIG. 1. When the device emits light in the direction opposite to that of FIG. 1, a substrate transmissive of light is used as the substrate 10 and the circular polarizing plate having $AlN_XO_Y$ films is bonded to the side of the substrate 10 that does not have the layer 11 including an OLED or including an OLED and a TFT.

Figure 12:
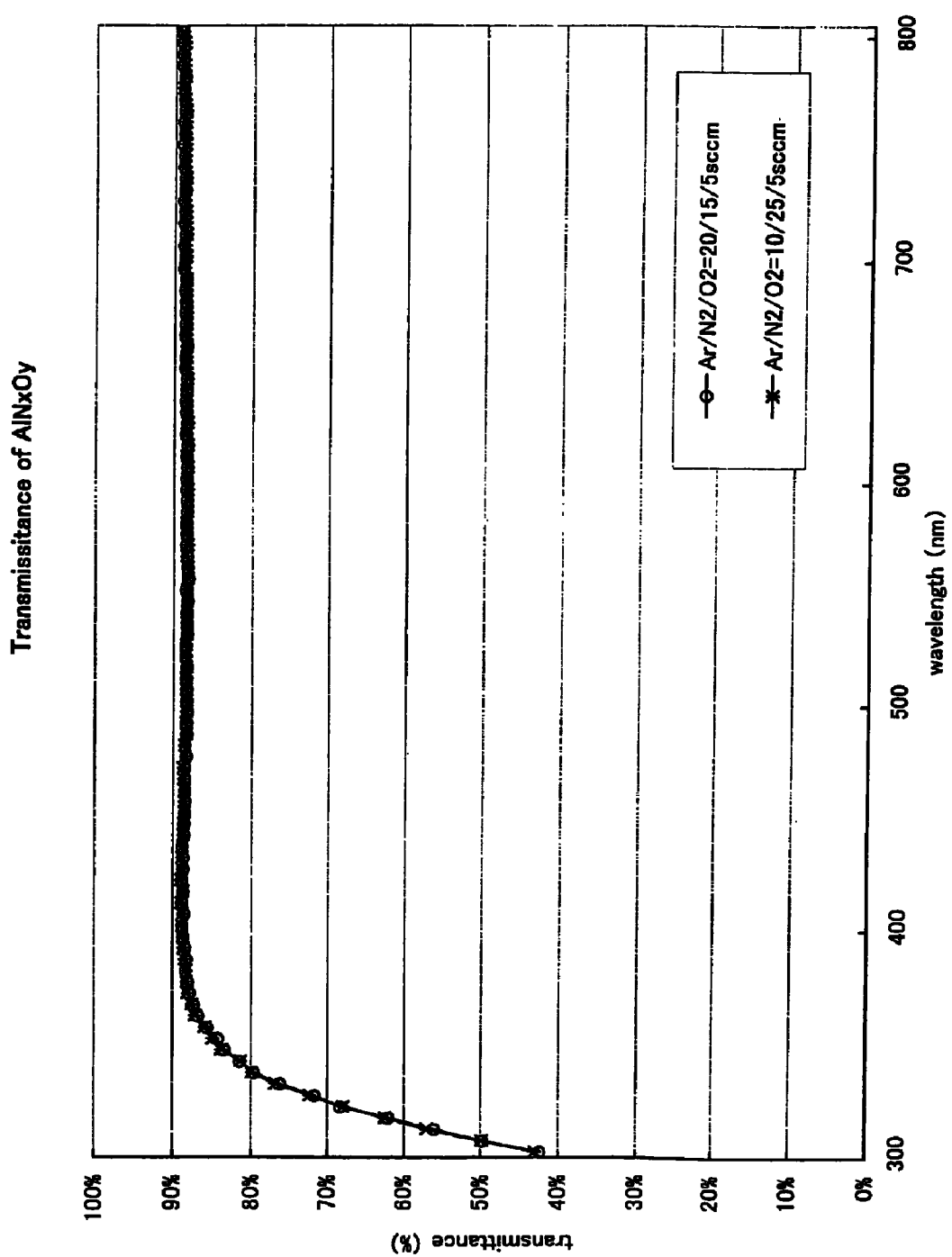
FIG. 12 is a graph showing transmission factor of $AlN_XO_Y$ film of the present invention.

FIG. 12 shows the transmittance of an $AlN_XO_Y$ film of 100 nm in thickness. As shown in FIG. 12, the light transmittance of the $AlN_XO_Y$ film is very high (having a transmittance of 80 to 90% in a visible light range) and does not block light emitted from a light emitting element.

Figure 13:
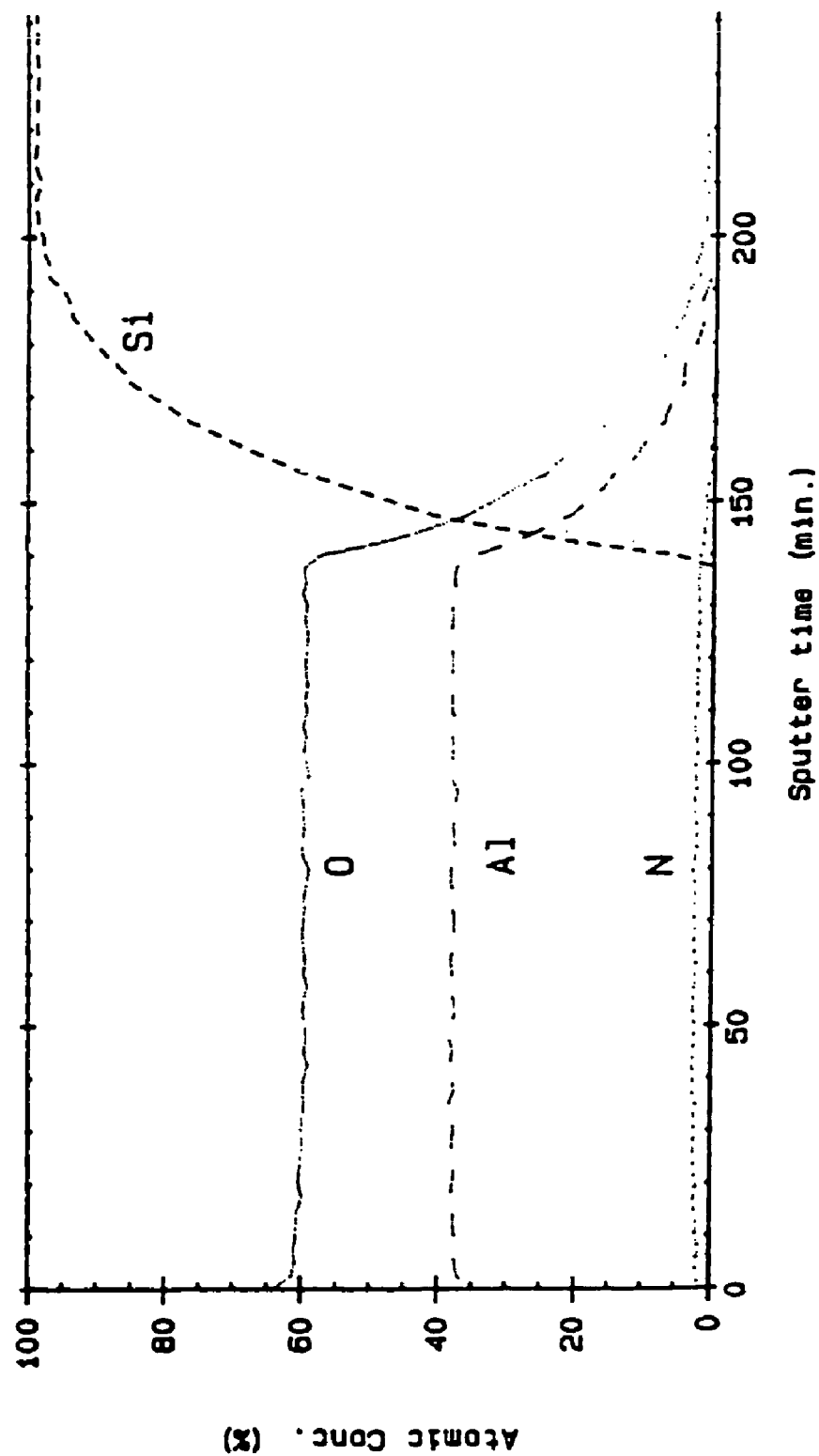
FIG. 13 is an ESCA analysis result of $AlN_XO_Y$ film of the present invention.

In the present invention, an $AlN_XO_Y$ film is formed by sputtering using, for example, an aluminum nitride (AlN) target in an atmosphere containing a mixture of argon gas, nitrogen gas, and oxygen gas. It is sufficient if the $AlN_XO_Y$ film formed contains several atm % of nitrogen, preferably, 2.5 to 47.5 atm %. The nitrogen concentration in the film can be adjusted by adjusting sputtering conditions (substrate temperature, the type and flow rate of material gas, film formation pressure, and the like) suitably. The composition of the obtained $AlN_XO_Y$ film is analyzed by ESCA (electron spectroscopy for analysis) and shown in FIG. 13. The $AlN_XO_Y$ film may be formed using an aluminum (Al) target in an atmosphere containing nitrogen gas and oxygen gas. The method to form the $AlN_XO_Y$ film is not limited to sputtering, and evaporation or other known techniques may be employed.

An experiment for confirming the effect of an $AlN_XO_Y$ film to block moisture and oxygen has been conducted. In the experiment, a sample obtained by sealing an OLED with a film substrate on which an $AlN_XO_Y$ film is formed to a thickness of 200 nm and a sample obtained by sealing an OLED with a film substrate on which a SiN film is formed to a thickness of 200 nm are prepared and heated in a 85° C. steam atmosphere to observe their changes with time. According to the experiment, the sample having the $AlN_XO_Y$ film has longer OLED lifetime and can emit light longer than the sample having the SiN film. It is read from the experiment result that an $AlN_XO_Y$ film is more suitable than a SiN film as a material film for preventing permeation of moisture, oxygen, and other external impurities that accelerate degradation of an organic compound layer.

The effect of an $AlN_XO_Y$ film to block an alkaline metal is confirmed as follows:

A thermal oxide film with a thickness of 50 nm is formed on a silicon substrate, an $AlN_XO_Y$ film with a thickness of 40 nm is formed thereon, and an aluminum electrode containing Li is formed on the $AlN_XO_Y$ film. An aluminum electrode containing Si is formed on the side of the silicon substrate opposite to the side where the above films are formed and the substrate is heat-treated at 300° C. for an hour. Then a BT stress test (±1.7 MV/cm, 150° C., an hour) is performed on the substrate to measure the MOS characteristic (C-V characteristic). The obtained C-V characteristic shifts to the plus side when a plus voltage is applied, in other words, when it is +BT. Therefore it is confirmed that the cause of the shift is not Li but the $AlN_XO_Y$ film exerting its alkaline metal blocking effect. For comparison, an insulating film (a silicon nitride film with a thickness of 100 nm) is formed on a MOS and an AlLi alloy film is formed on the insulating film to measure a characteristic change of the MOS in a similar manner. The C-V characteristic of this MOS greatly shifts to the minus side when a plus voltage is applied, in other words, when it is +BT. The major cause of this is considered to be Li mixed in the active layer.

Embodiment Mode 2

Figure 2A:
FIGS. 2A and 2B are brief sectional views for explaining an organic polarizing film of the present invention.
Figure 2B:

FIGS. 2A and 2B are diagrams showing simplified examples of an organic polarizing film according to the present invention.

The present invention also includes an organic polarizing film having on one side a single layer or multilayer of a compound or compounds selected from $AlN_XO_Y$, $Al_XN_Y$, and $Al_2O_3$. An organic polarizing film 21 with an $AlN_XO_Y$ film 22 formed on one side is shown in FIG. 2A.

The present invention also includes an organic polarizing film having on each side a single layer or multilayer of a compound or compounds selected from $AlN_XO_Y$, $Al_XN_Y$, and $Al_2O_3$. An organic polarizing film 23 with an $AlN_XO_Y$ film 24a formed on one side and an $AlN_XO_Y$ film 24b formed on the other side is shown in FIG. 2B.

The term organic polarizing film here refers to a polarizing film or a phase difference film, or a combination of the two and, specifically, it refers to a single layer or multilayer of polymer films. Polyvinyl alcohol-based films, ethylene vinyl alcohol-based films, cellulose-based films, and polycarbonate-based films are given as examples of an organic polarization film used in the present invention.

With a single layer or multilayer of a compound or compounds selected from $AlN_XO_Y$, $Al_XN_Y$, and $Al_2O_3$ formed on one side or each side, an organic polarizing film can have a function of effectively preventing penetration of an alkaline metal, an alkaline earth metal, and other such impurities. In particular, when an $AlN_XO_Y$ layer and an $Al_XN_Y$ layer are used, an effect of diffusing generated heat is obtained as well as an effect of protecting the organic polarizing film against deformation and alteration.

As shown in FIG. 12, the light transmittance of an $AlN_XO_Y$ film is very high (having a transmittance of 80 to 90% in a visible light range) and therefore does not form an obstruction to the polarizing function of the organic polarizing film.

The organic polarizing film thus obtained can be used as an antireflection film for electronic desktop calculators, electronic watches, word processors, liquid crystal display devices for meters of automobiles and machines, sunglasses, dust-proof glasses, 3-D glasses, and display elements (CRTs, LCDs, and the like).

The organic polarizing film is very advantageous particularly when used as an antireflection means for preventing background images from being reflected on the screen of a light emitting device having an OLED since the film can also prevent oxygen and moisture from seeping into an organic light emitting layer.

More detailed descriptions will be given on the present invention structured as above through the following embodiments.

Embodiment 1

An embodiment of the present invention is described with reference to FIGS. 3A to 3D and 4A to 4D. Here, a method of simultaneously manufacturing a CMOS circuit in which n-channel TFT and p-channel TFT are complementarily combined is described in detail.

First, the first material layer 101, the second material layer 102, a base insulating film 103 are formed on a substrate 100 and a semiconductor film having a crystalline structure is obtained. Then, the semiconductor film is etched to have a desired shape to form semiconductor layers 104 and 105 separated from one another in an island shape.

A glass substrate (#1737) is used as the substrate 100.

For the first material layer 101, it has a characteristic of having a tensile stress within a range of 1 to $1 \times 10^{10}$ (Dyne/$cm^2$) after the filming process or directly before the peeling process. If materials using for the above-mentioned first material layer 101 having a tensile stress within the above-mentioned range, the material is not particularly limited to specific materials. A layer or lamination layer from the following material can be used for the first material layer 101; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Especially, a tungsten film, a tungsten nitride film or a titanium nitride film is preferable. Note that, a film having a tensile stress with more than 1 to $1 \times 10^{10}$ (Dyne/ $cm^2$) is easy to peel in case of applying the heat treatment. Here, titanium nitride film having film thickness of 100 nm laminated by a sputtering method is used. Note that, a buffer layer may be formed in the case that the first material layer 101 is poorly adhered to the substrate 100.

For the second material layer 102, it has a characteristic of having a compressive stress within a range of −1 to $-1 \times 10^{10}$ (Dyne/ $cm^2$). If materials using for the second material layer 102 have a compressive stress within the above-mentioned range, the material is not particularly limited. Any one layer or a lamination layer of the following material can be used for the second material layer 102; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Note that, a film having a compressive stress with more than $-1 \times 10^{10}$ (Dyne/ $cm^2$) is easy to peel in case of applying the heat treatment. Especially, a single layer or a lamination layer composed of oxide silicon material or oxide metal material is preferable. A silicon oxide film having film thickness of 200 nm laminated by a sputtering method is used. The bonding force between the first material layer 101 and the second material layer 102 is strong against the heat treatment, so that the film peeling (also referred to as peeling) or the like does not occur. However, it can be easily peeled off on the inside of the second material layer or on the interface by the physical means.

For the base insulating film 103, a silicon oxynitride film formed from $SiH_4$, $NH_3$, and $N_2O$ as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon oxynitride film formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD.

In this embodiment, the base film 103 is shown in a form of a two-layer structure, but a single layer of the above-mentioned insulating film or a structure in which two or more layers thereof are laminated may be adopted. Further, there is no limitation on the material of the semiconductor film. However, the semiconductor film may be preferably formed of silicon or silicon germanium ($SiXGe1-X$ (X=0.0001 to 0.02)) alloy by using a known means (sputtering, LPCVD, plasma CVD or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface.

Then, a nickel acetate salt solution containing nickel of 10 ppm in weight is applied using a spinner. Instead of the application, a method of spraying nickel elements to the entire surface by sputtering may also be used.

Then, the heat treatment is conducted to perform crystallization, thereby forming a semiconductor film having a crystalline structure. The heat treatment using an electric furnace or irradiation of strong light may be conducted for this heat treatment. In case of the heat treatment using an electric furnace, it may be conducted at 500 to 650° C. for 4 to 24 hours. Here, after the heat treatment (500° C. for 1 hour) for dehydrogenation is conducted, the heat treatment (550° C. for 4 hours) for crystallization is conducted, thereby obtaining a silicon film having a crystalline structure. Note that, although crystallization is performed by using the heat treatment using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser or an $YVO_4$ laser is used for the laser light. Both the pulse oscillation and the continuous oscillitation are acceptable for the first laser light. In case of applying the pulse oscillitation, that of a repetition frequency is set to approximately 10 to 1000 Hz, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 $mJ/cm^2$. Note that an oxide film is formed on the surface by the first laser light irradiation since the irradiation is conducted in an atmosphere or in an oxygen atmosphere.

Next, after the oxide film formed by the first laser light irradiation is removed by dilute hydrofluoric acid, the second laser light irradiation is performed in a nitrogen atmosphere or in a vacuum, thereby the semiconductor film surface is leveled. Excimer laser light with a wavelength of 400 nm or less, or second harmonic wave or third harmonic wave of a YAG laser is used as the laser light (the second laser light). The energy density of the second laser light is made larger than that of the first laser light, preferably made larger by 30 to 60 mJ/cm$^2$. Here, the second laser light irradiation is performed with a repetition frequency of 30 Hz and energy density of 453 mJ/cm$^2$ to thereby set a P-V value (Peak to Valley, the difference between the maximum value and the minimum value in height) of unevenness in the semiconductor film surface to 50 nm or less. Here, the P-V value of unevenness may be obtained by AFM (atomic force microscope).

Further, although the second laser light irradiation is conducted over the surface in this embodiment, a step of selectively performing irradiation at least on a pixel portion may be adopted since the reduction of an off current particularly has an effect on a TFT of the pixel portion.

Next, the surface is processed with ozone water for 120 seconds, thereby forming a barrier layer comprised of an oxide film with a thickness of 1 to 5 nm in total.

Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration of the argon element contained in the amorphous silicon film is $3 \times 10^{20}$/cm$^3$ to $6 \times 10^{20}$/cm$^3$, and the atomic concentration of oxygen is $1 \times 10^{19}$/cm$^3$ to $3 \times 10^{19}$/cm$^3$. Thereafter, the heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is preferable that the barrier layer comprised of the oxide film is removed after gettering. Although, the example of performing the gettering is shown here, there is no particular limitation and other gettering method can be used.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 104 and 105 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 106, is formed. In this embodiment, a silicon oxynitride film (composition ratio: Si=32%, O=59%, N=7%, H=2%) is formed with a thickness of 115 nm by plasma CVD.

Figure 3A:
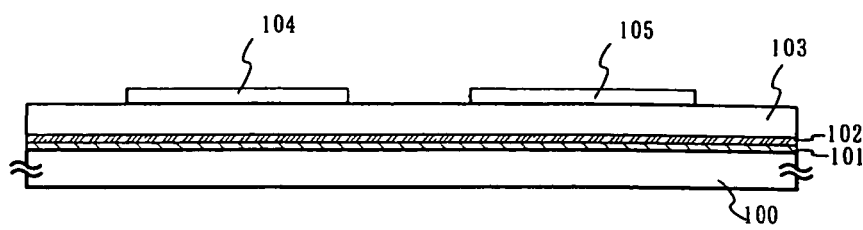
FIGS. 3A to 3D are diagrams showing a manufacturing process of TFT.
Figure 3B:
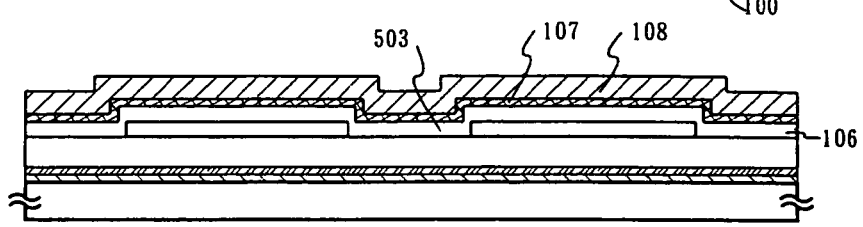

Next, as shown in FIG. 3B, on the gate insulating film 106, a first conductive film 107 with a thickness of 20 to 100 nm and a second conductive film 108 with a thickness of 100 to 400 nm are formed in lamination. In this embodiment, a 50 nm thick tantalum nitride film and a 370 nm thick tungsten film are sequentially laminated on the gate insulating film 106.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Figure 3C:
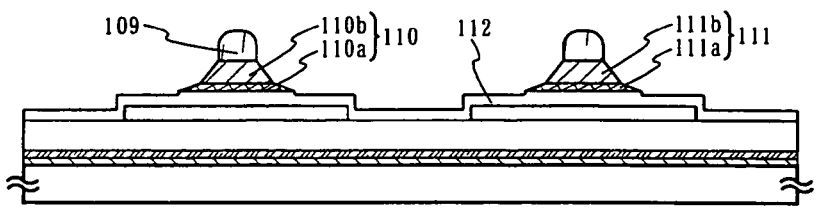

Next, as shown in FIG. 3C, masks 109 is formed by a light exposure step, and a first etching process for forming gate electrodes and wirings is performed. An ICP (Inductively Coupled Plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by Cl$_2$, BCl$_3$, SiCl$_4$, CCl$_4$ or the like, fluorine-based gases typified by CF$_4$, SF$_6$, NF$_3$, or the like and O$_2$ can be appropriately used as etching gases.

In the first etching process, the edges of the films can be tapered owing to the shape of the resist mask and the effect of the bias voltage applied to the substrate side. The angle of the tapered portion is set to 15 to 45°. In order to etch the films without leaving any residue on the gate insulating film, the etching time is prolonged by about 10 to 20%. The selective ratio of the silicon oxynitride film to the W film is 2 to 4 (typically, 3), and hence the exposed surface of the silicon oxynitride film is etched by about 20 to 50 nm through the over-etching treatment. Through the first etching treatment, the first shape conductive layers 110 and 111 (first conductive layers 110*a* and 111*a* and second conductive layers 110*b* and 111*b*) are formed from the first conductive film and the second conductive film. Reference numeral 112 is a gate insulating film and a region of the gate insulating film which is not covered with the first shape conductive layers is etched and thinned by about 20 to 50 nm.

Figure 3D:
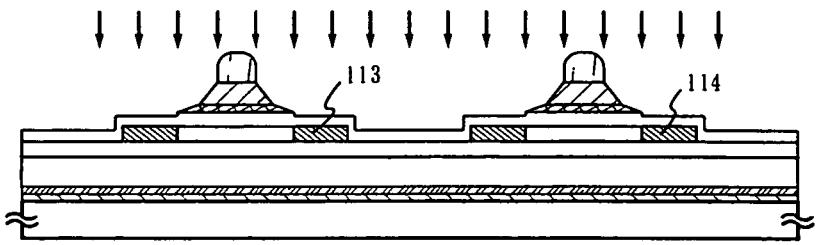

Then the first doping treatment is performed to dope the film with an n-type impurity (donor) (FIG. 3D). The doping is made by ion doping or ion implantation. In ion doping, the dose is set to $1 \times 10^{13}$ to $5 \times 10^{14}$/cm$^2$. Used as the impurity element for imparting the n-type conductivity is a Group 15 element, typically phosphorus (P) or arsenic (As). In this case, the first shape conductive layers 110 and 111 serve as masks against the element used for the doping and the acceleration voltage is adjusted appropriately (20 to 60 keV, for example). The impurity element thus passes through the gate insulating film 112 to form impurity regions (n+ region) 113 and 114. For example, the phosphorus (P) concentration in the impurity regions (n+ region) is set to $1\times10^{20}$ to $1\times10^{21}/cm^3$.

Figure 4A:
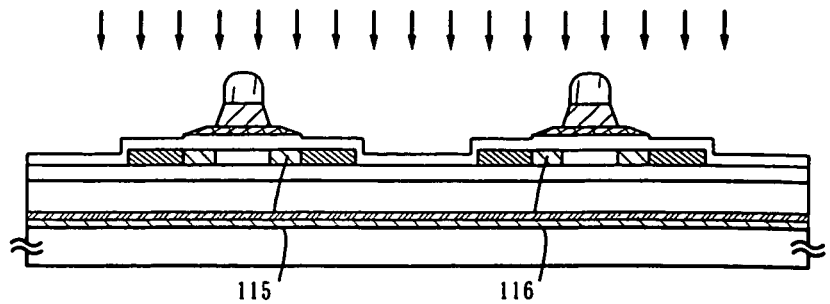
FIGS. 4A to 4D are diagrams showing a manufacturing process of TFT.

Then, the second doping treatment is carried out as shown in FIG. 4A. The film is doped with an n-type impurity (donor) in a dose smaller than in the first doping treatment at a high acceleration voltage. For example, the acceleration voltage is set to 70 to 120 keV and the dose is set to $1\times10^{13}/cm^2$. As a result, impurity regions are formed inside the first impurity regions that have been formed in the semiconductor layer in FIG. 3D. In the second doping treatment, the second conductive films 110b and 111b are used as masks against the impurity element and the impurity element reaches regions below the first conductive films 110a and 111a. Thus formed are impurity regions (n− region) 115 and 116 that overlap the first conductive films 110a and 111a, respectively. Since the remaining first conductive layers 110a and 111a have almost the uniform thickness, the concentration difference along the first conductive layers is small and the concentration in the impurity regions is $1\times10^{17}$ to $1\times10^{19}/cm^3$.

Figure 4B:
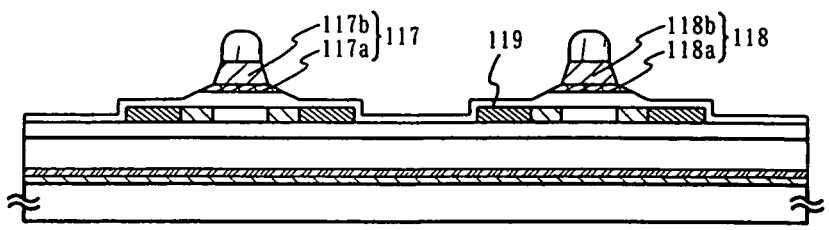

The second etching treatment is then conducted as shown in FIG. 4B. In this etching treatment, ICP etching is employed, $CF_4$, $Cl_2$ and $O_2$ are mixed as etching gas, and plasma is generated by giving RF (13.56 MHz) power of 500 W to a coil-shape electrode at a pressure of 1 Pa. RF (13.56 MHz) power of 50 W is also given to the substrate side (sample stage) so that a self-bias voltage lower than that of the first etching treatment can be applied. The tungsten film is subjected to anisotropic etching under these conditions so that the tantalum nitride film or the titanium film serving as the first conductive layers is remained. In this way, second shape conductive layers 117 and 118 (first conductive films 117a and 118a and second conductive films 117b and 118b) are formed. Reference numeral 119 is a gate insulating film and a region of the gate insulating film which is not covered with the second shape conductive layers 117 and 118 is further etched and thinned by about 20 to 50 nm.

Figure 4C:
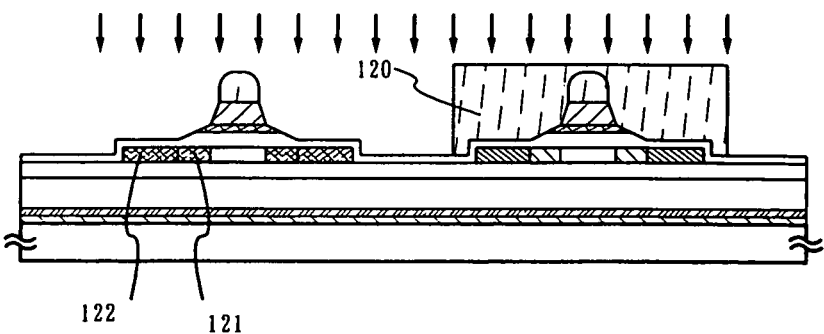

Then, a mask 120 made of resist is formed as shown in FIG. 4C, and a p-type impurity (acceptor) is doped with the semiconductor layer that forms the p-channel TFT. Typically, boron (B) is used. The impurity concentration in impurity regions (p+ region) 121 and 122 is set within the range of $2\times10^{20}$ to $2\times10^{21}/cm^3$. In addition, the impurity regions are doped with boron 1.5 to 3 times as much as phosphorus concentration contained in the impurity regions, thereby, the conductive type is inverted.

Figure 4D:
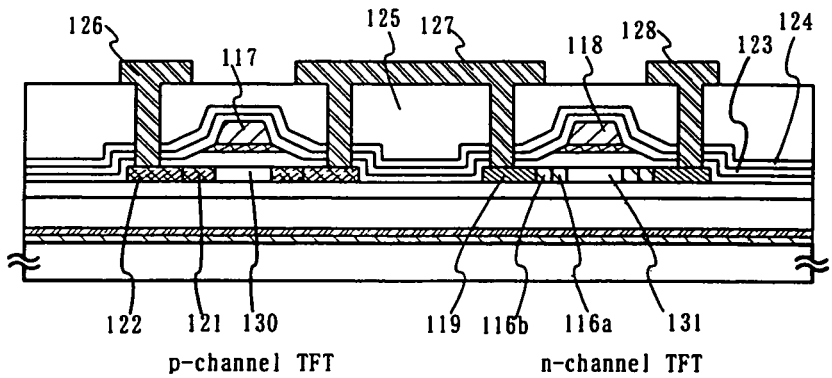

The impurity regions are formed in each semiconductor layer through the above steps. The second shape conductive layers 117 and 118 serve as gate electrodes. Thereafter, as shown in FIG. 4D, a protective insulating film 123 is formed of a silicon nitride film or a silicon oxynitride film by plasma CVD. The impurity elements that are doped the semiconductor layers are then activated for controlling the conductivity type.

A silicon nitride film 124 is formed and subjected to hydrogenation. Hydrogen is released from the silicon nitride film 124 as a result and hydrogen diffuses to the semiconductor layers. The semiconductor layers are thus hydrogenated.

An interlayer insulating film 125 is formed of an organic insulating material such as polyimide, acrylic and the like. A silicon oxide film formed by plasma CVD using TEOS (Tetraethyl Ortho silicate) may of course be adopted instead, but it is preferable to choose the above organic insulating material from the viewpoint of improving levelness.

Contact holes are formed next, so that source or drain wirings 126 to 128 are formed from aluminum (Al), titanium (Ti), tantalum (Ta) or the like.

In accordance with the above processes, a CMOS circuit obtained by combining an n-channel TFT and a p-channel TFT complementally is obtained.

A p-channel TFT has a channel formation region 130, and has the impurity regions 121 and 122 that function as source regions or drain regions.

An n-channel TFT has a channel formation region 131; an impurity region 116a (Gate Overlapped Drain: GOLD region) overlapping the gate electrode 118 that is formed of the second shape conductive layer; an impurity region 116b (LDD region) formed outside the gate electrode; and an impurity region 119 functioning as a source region or a drain region.

The CMOS circuit as such can be used to form a part of a driver circuit of an active matrix type light emitting device or an active matrix type liquid crystal display device. Besides, the n-channel TFT or the p-channel TFT as above can be applied to a transistor for forming a pixel portion.

By combining the CMOS circuits of this embodiment, a basic logic circuit, and further, a complicated logic circuit (such as a signal divider circuit, a D/A converter, an operation amplifier, a y correction circuit and the like) can be formed. It also can manufacture a memory or a microprocessor.

Embodiment 2

An example of fabrication of a light emitting device having an OLED by using TFTs obtained in Embodiment 1 will be described with reference to FIG. 5.

Figure 5:
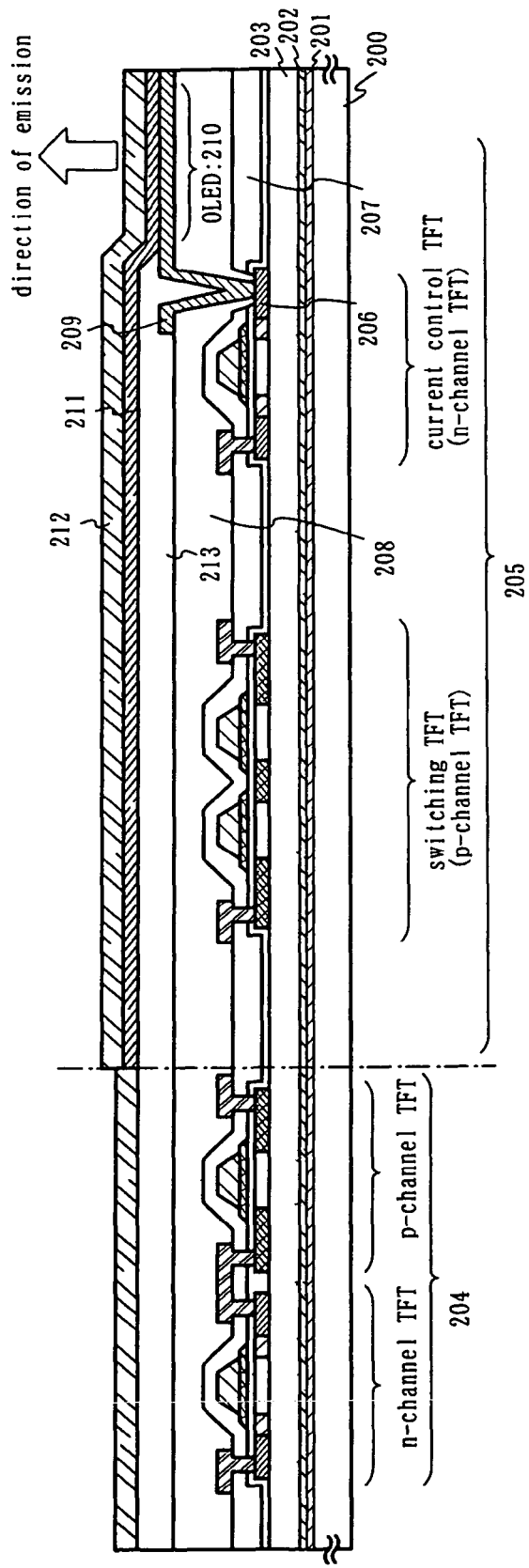
FIG. 5 is a cross sectional view showing an active matrix substrate on which an OLED is provided.

FIG. 5 shows an example of a light emitting device (in a state before sealing) having a pixel portion and a drive circuit for driving the pixel portion, the pixel portion and the drive circuit being formed on one insulating member. A CMOS circuit forming a basic unit in the drive circuit and one pixel in the pixel portion are illustrated. The CMOS circuit can be obtained in accordance with Embodiment 1.

Referring to FIG. 5, reference numeral 200 denotes a substrate, reference numeral 201 denotes a first material layer (such as W, WN, for example), and reference numeral 202 denotes a second material layer (such as $SiO_2$, for example). On a base insulating layer 203 formed on a element formation substrate, a driver circuit 204 constituted of a n-channel TFT and a p-channel TFT, a switching TFT constituted of a p-channel TFT, and a current control TFT constituted of a n-channel TFT are formed. In this embodiment, each of the TFTs is formed as a top gate TFT.

A specific description of the n-channel TFT and the p-channel TFT is the same as those in Embodiment 1. Therefore, the description for them is omitted in this embodiment. The switching TFT is a p-channel TFT of a structure having two channels forming regions between a source region and a drain region (double-gate structure). In this embodiment, the structure of the switching TFT is not limited to the double-gate structure, and the switching TFT may alternatively have a single-gate structure in which only one channel forming region is formed or a triple-gate structure in which three channel forming regions are formed.

A contact hole is formed in a first interlayer insulating film 207 above the drain region 206 of the current control TFT before a second interlayer insulating film 208 is formed. This is for the purpose of simplifying the etching step when a contact hole is formed in the second interlayer insulating film 208. A contact hole is formed in the second interlayer insulating film 208 so as to reach the drain region 206, and a pixel electrode 209 connected to the drain region 206 is formed in the contact hole. The pixel electrode 209 functions as the cathode of the OLED and is formed by using a conductive film containing an element belonging to the group I or II in the periodic table. In this embodiment, a conductive film of a compound composed of lithium and aluminum is used.

Reference numeral 213 denotes an insulating film formed so as to cover an end portion of the pixel electrode 209, and this insulating film will be referred to as a bank in this specification. The bank 213 may be formed of an insulating film containing silicon or a resin film. If a resin film is used, carbon particles or metal particles may be added to set the specific resistance of the resin film to $1 \times 10^6$ to $1 \times 10^{12}$ Ωm (preferably $1 \times 10^8$ to $1 \times 10^{10}$ Ωm), thereby reducing the possibility of dielectric breakdown at the time of film forming.

The OLED 210 is formed by the pixel electrode (cathode) 209, an organic compound layer 211, and an anode 212. As the anode 212, a conductive film of a large work function, typically an oxide conductive film is used. As this oxide conductive film, indium oxide, tin oxide, zinc oxide or some other compound of these elements may be used.

In this specification, organic compound layer is defined as a generic name to a lamination layer formed by combining with a light emitting layer, a hole injection layer, a hole transporting layer, a hole blocking layer, an electron transporting layer, an electron injection layer, or an electron blocking layer. However, the organic compound layer may comprise a single layer of organic compound film.

The material of the light emitting layer is an organic compound material but not limited to a particular one. It may be a high-molecular weight material or a low-molecular weight material. For example, a thin film formed of a light emitting material capable of emitting light by doublet excitation or a thin film formed of a light emitting material capable of emitting light by triplet excitation may be used as the light emitting layer.

It is effective to form a passivation film, not shown in the figure here, so as to completely cover the OLED 210 after the formation of the anode 212. A film having thermal conductivity, for example, a layer shown by $AlN_xO_y$, is suitably used as the passivation film. Also, an insulating film comprising a DLC film, a silicon nitride film or a silicon oxynitride film, or a lamination layer formed of a combination of such films may be used as the passivation film.

After the sealing (or enclosure) process is conducted to protect the OLED 210 by attaching a circular polarizing plate which has a single layer or a lamination layer selected from a layer shown by $AlN_xO_y$, a layer shown by $Al_xN_y$, or a layer shown by $Al_2O_3$ as shown in Embodiment Mode 1 thereon, and then, a substrate 200 provided the first materials 201 is peeled off. The second material layer and a film substrate are bonded together with a bond layer. It is preferable that plural barrier films and a layer that has a smaller stress (a stress relaxation film) than that of the barrier films are provided on the film substrate between the barrier films.

Note that the present invention can be implemented by combining with Embodiment Mode 2.

Embodiment 3

Here is shown an embodiment which is different from the process shown in the embodiment 2, and concretely, a peeling process and a bonding process will be described in detail with reference to FIGS. 6A to 6C and 7A and 7B.

Figure 6A:
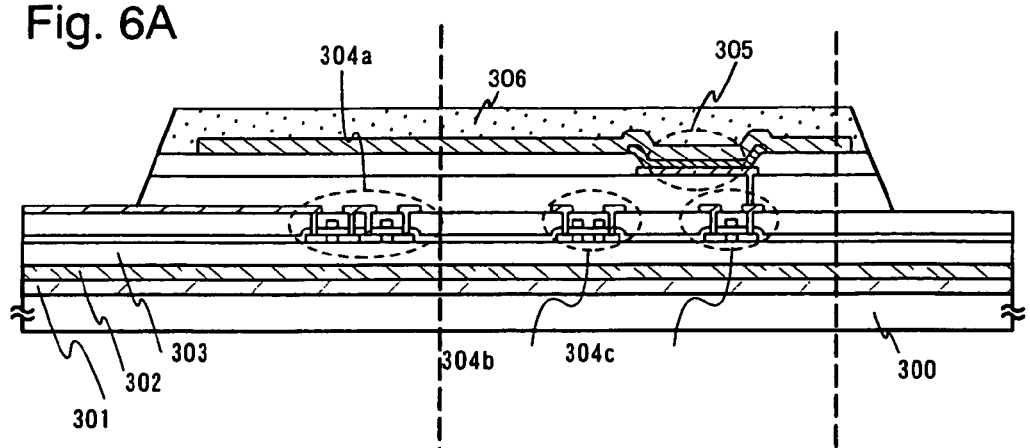
FIGS. 6A to 6C are process sectional views for explaining Embodiment 3.

In FIG. 6A, reference numeral 300 represents a substrate, 301 represents a nitride layer, 302 represents an oxide layer, 303 represents a base insulating layer, 304a to 304c represent elements, 305 represents an OLED, and 306 represents an interlayer insulating film.

In FIG. 6A, as the substrate 300, a glass substrate, a quartz substrate and a ceramic substrate can be used. Further, a silicon substrate, a metal substrate or a stainless steel substrate may be used.

Firstly, as shown in FIG. 6A, in accordance with the preferred Embodiment Modes, on the substrate 300, a first material layer 301 and a second material layer 302 are formed. It is important to differ film stress of this first material layer 301 from film stress of the second material layer 302. Each film thickness may be set at pleasure to be within a range of 1 nm to 1000 nm and each film stress may be adjusted.

Then, on the second material layer 302, a layer to be peeled off is formed. The layer to be peeled off may be a layer which contains various elements as represented by TFT (a thin film diode, a photoelectric conversion element having a PIN bonding with silicon and a silicon resistance element). Further, thermal processing can be carried out within a range that the substrate 300 can resist. In addition, in the invention, even when film stress of the second material layer 302 is different from film stress of the first material layer 301, peeling does not occur by thermal processing in a process for forming the layer to be peeled off. Here, as the layer to be peeled off, on the base insulating layer 303, elements 304a to 304b of the driving circuit 313 and an element 304c of the pixel portion 314 are formed, and an OLED 305 for electrically connecting to the element 304c of the pixel portion 314 is formed, and in order to cover the OLED, an interlayer insulating film (organic resin having translucency) 306 with film thickness of 10 to 1000 nm is formed (FIG. 6A).

Further, in case that unevenness is made on a surface by the first material layer 301 and the second material layer 302, the surface may be planarized before and after the base insulating layer is formed. Coverage is made to be better in the layer to be peeled off in case that planarization is carried out, and in case that the layer to be peeled off containing an element is formed, element characteristic is apt to be stabilized and therefore, it is preferable. In addition, as this planarization processing, an etch-back method for planarizing by carrying out an etching after a coating film (such as a resist film) is formed and a mechanical chemical polishing method (a CMP method) may be used.

Figure 6B:
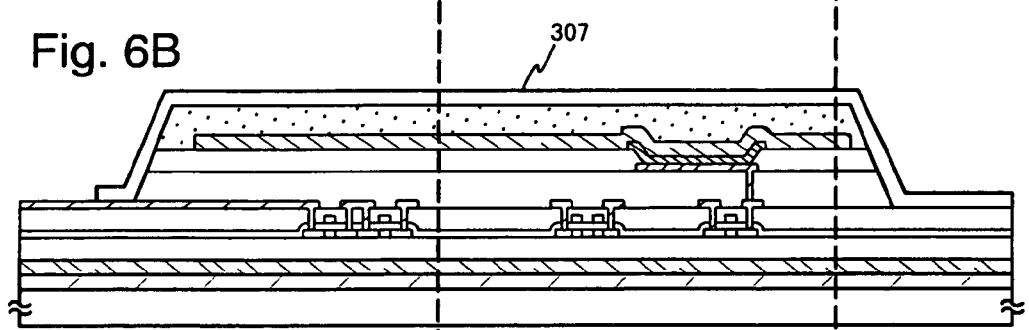

Then, on the interlayer insulating film 306, formed is a nitride oxide film 307 which is represented by an AlNxOy film with thickness of 10 to 1000 nm and contains aluminum (FIG. 6B). This AlNxOy film 307 functions as a protective film. Here, by use of an aluminum nitride (AlN) target, film forming is carried out under an atmosphere in which argon gas (20 sccm), nitrogen gas (15 sccm) and oxygen gas (5 sccm) are mixed. Further, by use of an aluminum (Al) target, film forming may be carried out under an atmosphere which contains the nitrogen gas and the oxygen gas. Furthermore, the AlNxOy film 307 has also an advantage for blocking intrusion of a material which expedites deterioration of the OLED, something like impurities such as moisture and oxygen from outside of the device.

Then, an FPC 310 and an IC chip (not shown in the figure) are attached by a COG (chip on glass) system, a TAB (tape automated bonding) system and a wire bonding method. Further, each wiring of each TFT elements and an input/output terminal 311 are coupled by a wiring (connecting wiring), and the FPC 310 is adhered to the input/output terminal 311 by an anisotropic conductive member. The anisotropic conductive member comprises a resin and a conductive particle with diameter of several dozen to several hundred μm on which surface, Au or the like is plated, and the input/output terminal and the wiring formed on the FPC are electrically connected by the conductive particle. An IC chip which has a memory, a CPU, a controller, a D/A converter and the like is adhered to the substrate in the same manner by the anisotropic conductive member, and by the conductive particle which is mixed in the resin, the input/output terminal disposed in the IC chip and a leader line or a connecting wiring and the input/output terminal are electrically connected.

Figure 6C:
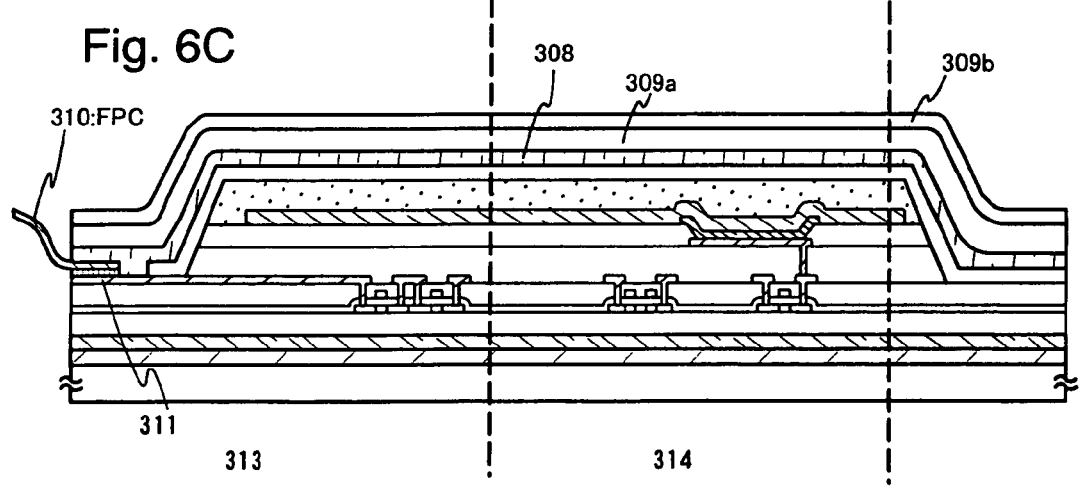

Then, a supporting body (a circular polarizing plate 309a on which AlNxOy film 309b is provided) 309 for fixing the layer to be peeled off to peel the substrate 300 by a physical means is attached by an adhesive layer 308 such as epoxy resin (FIG. 6C). Further, AlNxOy film which functions as a barrier film is provided on the circular polarizing plate 309a, therefore, the AlNxOy film can sufficiently prevent the intrusion of the impurities such as moisture and oxygen from into the organic light emitting layer.

Since the supporting body 309 is attached to cover the FPC 310 and the IC chip, connection of the input/output terminal 311 and the FPC is more strengthened by adhesion of the supporting body 309. Further, here was shown the example in which the supporting body is adhered after the FPC and the IC chip were adhered, but the FPC and the IC chip may be mounted after the supporting body is adhered.

Figure 7A:
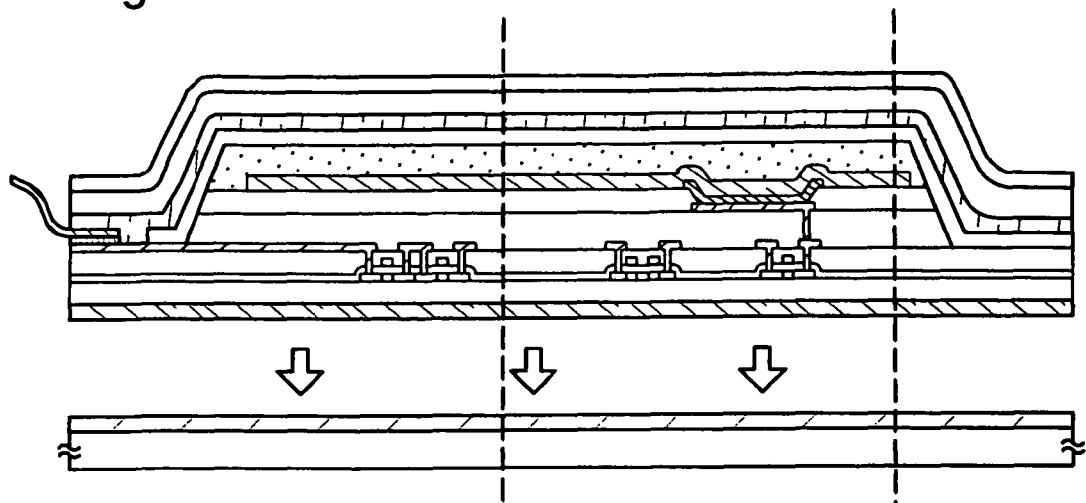
FIGS. 7A and 7B are process sectional views for explaining Embodiment 3.
Figure 7B:
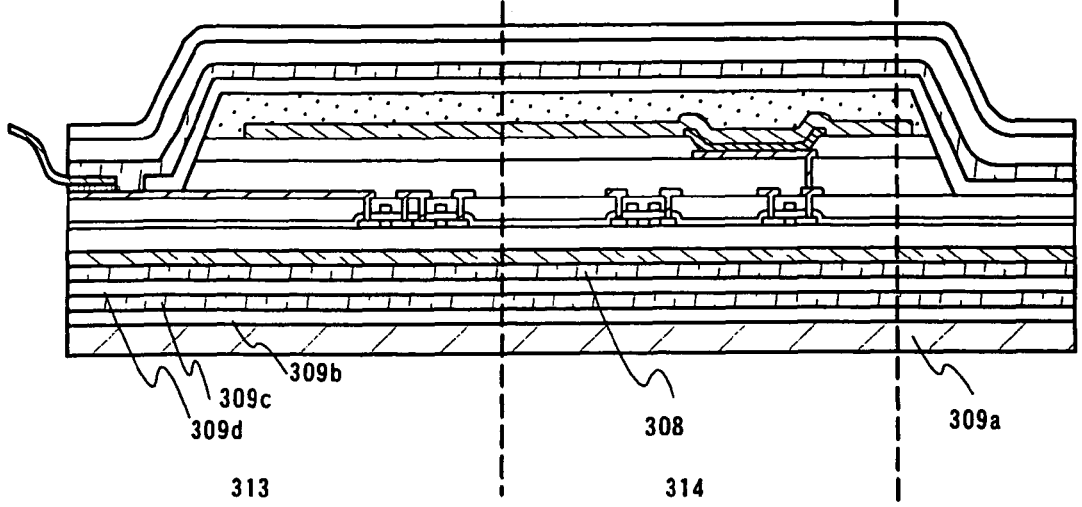

Then, the substrate 300 on which the first material layer 301 is formed is peeled off by the physical means. Since film stress of the second material layer 302 is different from film stress of the first material layer 301, it is possible to peel off by relatively small force. A bonding force of the first material layer 301 and the second material layer 302 has strength which can resist against thermal energy and, since respective film stresses are different and stress distortion exists between the first material layer 301 and the second material layer 302, it is weak to mechanical energy, and it is optimum to peel off. Thus, the layer to be peeled off which is formed on the second material layer 302 can be peeled off from the substrate 300. FIG. 7A shows a state after the peeling. In addition, this method of peeling is applied to the peeling of the layer to be peeled off having a small area, and besides, it is possible to peel off in all surfaces of the layer to be peeled off having a large area with good yield ratio.

Then, the second material layer 302 is attached to a transferring body 312a by the adhesive layer 308 such as epoxy resin. In this embodiment, shown is an example in which the adhesive layer is adhered to the protective film 307.

Further, here, weight saving is carried out by use of a plastic film substrate as the transferring body 312a. Furthermore, by disposing a lamination layer of a layer which functions as a barrier film and is represented by AlNxOy (called as AlNxOy film) 312b and a stress relaxation film (organic resin) 312c and an AlNxOy film 312d on the transferring body 312a, the barrier film effectively prevents intrusion of impurities such as moisture and oxygen in an organic light emitting layer. At the same time, a light emitting device having more flexibility can be obtained by providing a stress relaxing film between a plurality of barrier films, and an occurrence of crack can be prevented.

Thus, a light emitting device comprising an OLED formed on a plastic substrate having flexibility is completed.

In this specification, the transferring body is bonded to the layer to be peeled off after the peeling. The transferring body is not limited to a material having any composition, for example, plastic, glass, metal, ceramic or the like can be used as the transferring body. The shape of the transferring body and the supporting body is not limited, the shape may be a plane or a film and have a curved surface. If the lightening is prioritized, a film plastic substrate is preferable as follows, for example, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT) or the like.

Note that the present embodiment can be implemented by combining with Embodiment Mode 2.

Embodiment 4

Although, an example of cohering with a circular polarizing plate by adhering an adhesive layer with a protective film is shown in Embodiment 3, an example of an air gap provided between a circular polarizing plate and a protective film is described with reference to FIGS. 8A to 8B in this embodiment.

Figure 8A:
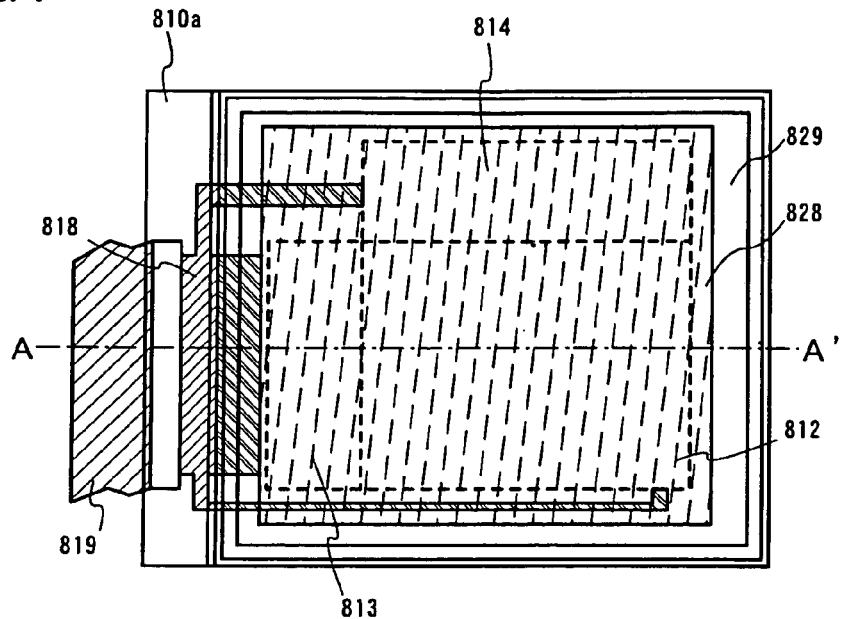
FIGS. 8A and 8B are cross sectional views of an EL module for explaining Embodiment 4.
Figure 8B:
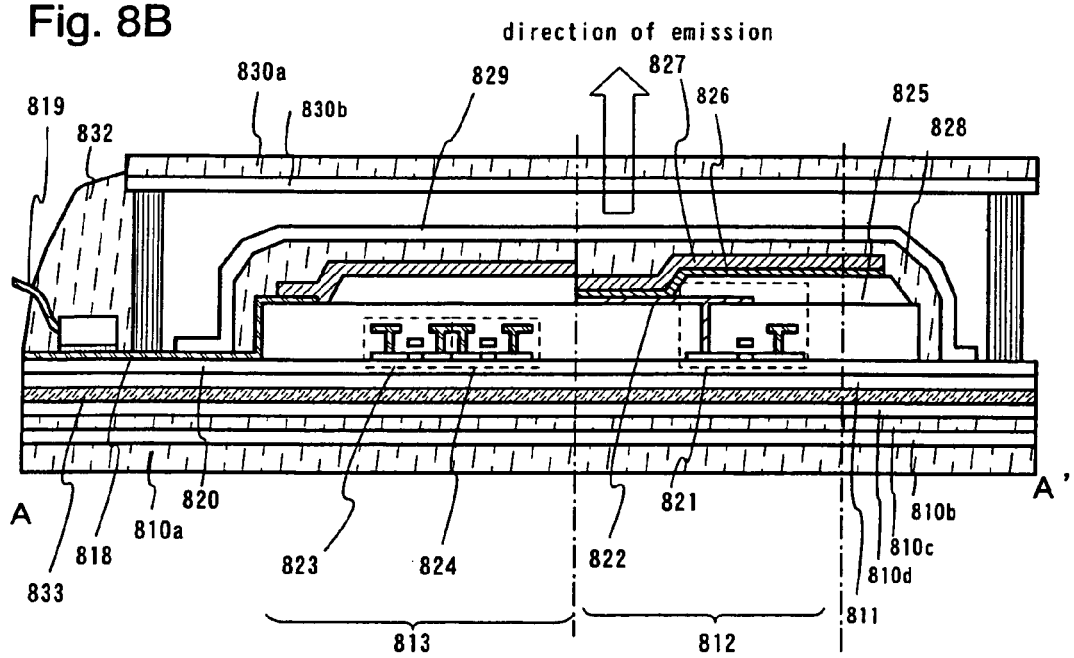

FIG. 8A is a top view which shows an EL module, and FIG. 8B is a sectional view cut along a line of A-A' of FIG. 8A. In FIG. 8B, a layer 810b which functions as a barrier film at a surface and is represented by AlNxOy (called also as an AlNxOy film), a stress relaxation film (organic resin) 810c, and a film substrate 810a (such as a plastic substrate, for example) having flexibility on which surface disposed is a lamination layer of an AlNxOy film 810d are adhered to an insulating film 811 by an adhesive layer 833. In addition, a material which stress is smaller than that of the barrier film may be used as the adhesive layer 833 and it may be made to function as a stress relaxation film. As just described, by layering a plurality of barrier films 810b and 810d, even in case that the barrier film suffers some cracks, other barrier film effectively prevents impurities such as moisture and oxygen from getting into the organic light emitting layer. In addition, by disposing the stress relaxation film between a plurality of barrier films, obtained is a light emitting device which is more flexible and cracks may be prevented when it is bent.

In addition, here, insulating films 811 and 820 are disposed on a substrate having heat resistance, a pixel portion 812, a source side driving circuit 814 and a gate side driving circuit 813 are formed thereon, and thereafter, a covering member which is a circular polarizing plate 830a in this embodiment is adhered to fix them and the substrate having heat resistance is peeled off, and thereafter, the film substrate is attached, but this is not particularly limited, and it should be appreciated that the film substrate may be a film substrate which can resist temperature for forming the pixel portion 812, the source side driving circuit 814 and the gate side driving circuit 813, and the pixel portion 812, the source side driving circuit 814 and the gate side driving circuit 813 are formed on the film substrate and in that case, it is not necessary to dispose an adhesive layer.

A technology for peeling the substrate having heat resistant (a glass substrate and a quartz substrate) is not limited particularly, and here, used is a method for peeling by use of internal stress of a film, to be more precise, a method in which disposed on the substrate having heat resistance is a lamination film of a first material layer and a second material layer in which abnormality on a process such as peeling due to thermal processing does not occur and an element (TFT and a light emitting element) is formed on the lamination layer and thereafter, it is finely separated easily in a layer or a boundary surface of the second material layer by physical means, typically by applying a mechanical force, for example, peeling off by use of a human hand. Since a bonding force of the first material layer and the second material layer has a strength which can resist against thermal energy and right before peeling, has a stress distortion between the first material layer having tensile stress and the second material layer having compression stress, it is weak to mechanical energy and thus the first and second material layers are peeled off. Here, since the peeling was carried out by using a tungsten film as the first material layer and by using a silicon oxide film by spattering method as the second material layer, the insulating film 811 corresponds to the second material layer.

Further, as another technology for peeling off the substrate having heat resistance, a peeling method for peeling off a layer to be peeled off through a separation layer from the substrate (Japanese Patent Laid-Open No. 10-125929 gazette, Japanese Patent Laid-Open No. 10-125931 gazette) may be used. A technology described in the gazettes is one in which a separation layer which comprises amorphous silicon (or polysilicon) is disposed, and hydrogen contained in the amorphous silicon is discharged by irradiating laser light through the substrate so that an air gap is formed and thereby, the substrate is separated.

In FIG. 8B, on the insulating film 820, the pixel portion 812 and the gate side driving circuit 813 are formed, and the pixel part 812 is formed by a plurality of pixels containing a TFT 821 for current control and a pixel electrode (cathode) 822 which is electrically connected to its drain. As the TFT 821 for current control, it is possible to use a p-channel TFT but preferable to use an n-channel TFT. Further, the gate side driving circuit 813 is formed by use of a CMOS circuit which is configured by combining an n-channel TFT 823 and a p-channel TFT 824. As an active layer of each TFT, a semiconductor film (polysilicon film) having a crystalline structure and a semiconductor film (for example, amorphous silicon film) having an amorphous structure are used.

Further, the pixel electrode 822 functions as a cathode of a light emitting element (OLED). Furthermore, at both sides of the pixel electrode 822, a bank 825 is formed, and on the pixel electrode 822, an organic compound layer 826 and an anode 827 of the light emitting element are formed.

As the organic compound layer 826, it should be appreciated that the organic compound layer (a layer for carrying out light emission and movement of carriers therefor) may be formed by freely combining a light emitting layer, an electric charge transport layer or an electric charge injection layer. For example, low molecular series organic compound material and high molecular series organic compound material may be used. Further, as the organic compound layer 826, a thin film which comprises a light emitting material (singlet compound) which emits light by singlet excitation, or a thin film which comprises a light emitting material (triplet compound) which emits light (phosphorous light) by triplet excitation may be used. Furthermore, it is possible to use an inorganic material such as silicon carbide as the electric charge transport layer and the electric charge injection layer. As these organic and inorganic materials, well-know materials can be used.

The anode 827 functions as a common wiring to all pixels, and is electrically connected to an FPC 819 through a connection wiring 818. Further, elements which are contained in the pixel portion 812 and the gate side driving circuit 813 are all covered by the anode 827, an organic resin 828 and a protective film 829.

Further, in FIG. 8A, reference numeral 828 represents the organic resin and 829 represents the protective film, and the pixel portion 812 and driving circuits 813 and 814 are covered by the organic resin 828, and the organic resin is covered by the protective film (AlNxOy film) 829. In addition, as the organic resin 828, it is preferable to use a transparent or half transparent material to visible light to the extent possible. Further, it is preferable that the organic resin 828 is a material which does not transmit impurities such as moisture and oxygen to the extent possible.

Moreover, the pixel portion 812 and the driving circuits 813 and 814 are sealed by a circular polarizing plate 830a by use of adhesive. The circular polarizing plate 830a is adhered as a supporting body before peeling. In addition, in case that the peeling is carried out after the circular polarizing plate 830a as the supporting body is adhered, there exist only insulating films 820 and 811 at a portion of a wiring lead-out terminal (connecting portion) and mechanical strength is weakened and therefore, before peeling, the FPC 819 is affixed and further, fixed by an organic resin 832.

Here, it is preferable that in order to resist against transformation due to heat or external force, as the circular polarizing plate 830a, one which is the same material as the film substrate 810a, for example, a plastic substrate may be used. In addition, in order to block intrusion of impurities such as moisture and oxygen, an AlNxOy film 830b is formed in advance on the circular polarizing plate 830a. Here, in order to transmit emitting light through the circular polarizing plate, a barrier layer (AlNxOy film 830b) as a single layer was used, but in the same manner as in the film substrate 810a, a plurality of barrier layers and a layer (stress relaxation film) which is disposed between the barrier layers and has smaller stress than that of the barrier layer may be used. In that case, as a stress relaxation film, one that has high translucency is used.

In addition, reference numeral 818 represents a wiring for transmitting signals to be inputted into the source side driving circuit 814 and the gate side driving circuit 813, and it receives a video signal and a clock signal from the FPC (flexible print circuit) 819 which becomes an external input terminal. In addition, here, only FPC is shown in the figure, but a printed wiring board (PWB) may be attached to this FPC. An EL module in the present specification is assumed to contain not only a main substrate on which a light emitting element is disposed but also a state in which FPC or PWB is attached thereto.

By sealing the light emitting element by the barrier films 810b and 810d represented by AlNxOy and the protective film 829 represented by AlNxOy by use of the above-described structure, the light emitting element can be completely blocked from an ambient air and it is possible to block intrusion of a material for inducing deterioration of which main cause is oxidization of the organic compound layer by moisture and oxygen from outside of the device. In addition, heat developed can be exhaled by AlNxOy film having a thermal conduction characteristic. Accordingly, it is possible to obtain a light emitting device which has high reliability.

In addition, by disposing a stress relaxation film between plural barrier films, obtained is a light emitting device which is not broken even when an external force is applied and flexible.

Incidentally, on the film substrate 810a, the pixel portion 812, the driving circuit and the light emitting element are disposed. It is possible to form complex integrated circuits (such as a memory, a CPU, a controller and a D/A converter) on the same substrate as that on which these pixel portion and the driving circuit are formed, but it is difficult to manufacture it by use of small number of masks. Accordingly, it is preferable to carry out mounting one IC chip which has the memory, the CPU, the controller and the D/A converter by a COG (chip on glass) system, a TAB (tape automated bonding) system and a wire bonding method. It should be appreciated that the IC chip may be mounted after the film substrate 810a and the circular polarizing plate 830a are adhered, and the IC chip may be sealed by the circular polarizing plate 830a after the IC chip is mounted on the film substrate 810a.

Incidentally, here, only FPC is shown in the figure but a printed wiring board (PWB) may be attached to this FPC.

Further, it should be appreciated to form a structure in which the pixel electrode is made to be an anode, and the organic compound layer and the cathode are layered, and light is emitted in an opposite direction to FIG. 8. In that case, it is preferable to use the p-channel type TFT as the TFT for current control.

Note that this embodiment can be implemented by combining with Embodiment Mode 2.

Embodiment 5

Figure 9:
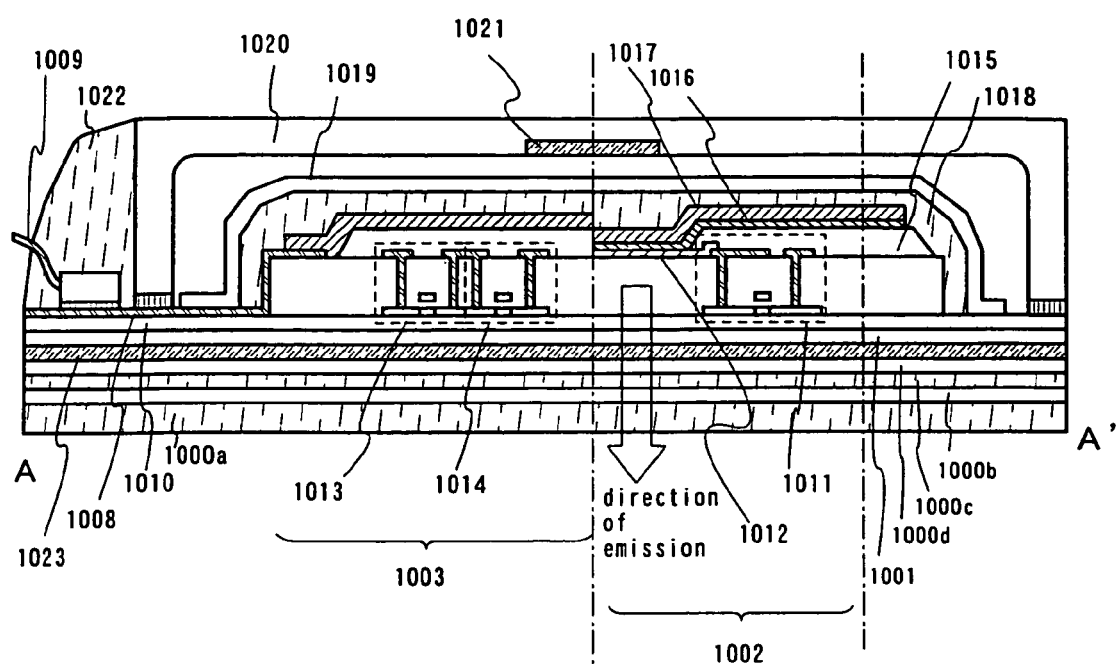
FIG. 9 is a cross sectional view of an EL module for explaining Embodiment 5.

In this embodiment, a pixel electrode is used as an anode and an organic compound layer and a cathode are laminated to emit light in a direction opposite to the direction indicated in the Embodiment 4 (FIG. 8). FIG. 9 shows an example of such a structure. The top view is not illustrated because it is same as FIG. 8A.

The cross-sectional structure shown in FIG. 9 is described. A circular polarizing plate 1000*a* provided with the lamination layer composed of a AlNxOy film 1000*b*, a stress relaxation film 1000*c* and a AlNxOy film 1000*d* is bonded to the insulating film 1001 with an adhesive layer 1023. An insulating film 1010 is formed on the insulating film 1001. The pixel portion 1002 and the gate driving circuit 1003 are formed above the insulating film 1010. The pixel portion 1002 is composed of the current control TFT 1011 and plural pixels including the pixel electrode 1012 that is connected electrically to the drain of the current control TFT 1011. The current control TFT 1011 is possible to use an n-channel TFT, however, it is prefer to use a p-channel TFT. In addition, the gate driving circuit 1003 is formed by using a CMOS circuit that is combined with the n-channel TFT 1013 and the p-channel TFT 1014.

These TFTs (included 1011, 1013, 1014) may be fabricated in the same manner as an n-channel TFT 201 and a p-channel TFT 202 in Embodiment 1.

The pixel electrode 1012 functions as an anode of the light emitting element (OLED). Banks 1015 are formed at opposite ends of the pixel electrode 1012, and an organic compound layer 1016 and a cathode 1017 of the light emitting element are formed over the pixel electrode 1012.

The cathode 1017 also functions as a common wiring element connected to all the pixels and is electrically connected to a FPC 1009 via connection wiring 1008. All the elements included in the pixel portion 1002 and the gate driving circuit 1003 are covered with the cathode 1017, an organic resin 1018 and a protective film 1019. It is possible to apply the AlNxOy film the same as the AlNxOy film 1000*b* as the protective film 1019 and it is bonded to a cover member 1020 by an adhesive layer. A recess portion is formed in the cover member and a desiccant 1021 is set therein.

In the case where the cover member 1020 is formed so as to have a cavity as shown in FIG. 9, a portion corresponding to the wiring lead-out terminal is only the insulating film 1010 at the time of peeling-off after bonding of the cover member 1020 provided as the supporting member, and then the mechanical strength of this portion is low. Therefore, it is desirable that the FPC 1009 be attached before peeling-off and fixed by an organic resin 1022.

In the FIG. 9, the pixel electrode is used as the anode while the organic compound layer and the cathode are laminated, so that light is emitted in the direction of the arrow in FIG. 9.

While the top gate TFTs have been described as an example, the present invention can be applied irrespective of the TFT structure. For example, the present invention can be applied to bottom gate (inverted staggered structure) TFTs and staggered structure TFTs.

Note that the present invention can be implemented by combining with Embodiment Mode 2.

Embodiment 6

The EL module formed by implementing the present invention can be used in various display portions of electronic apparatuses. That is, the present invention can be implemented in all of electronic apparatus integrated with the EL modules at display portions thereof.

As such electronic apparatus, there are pointed out a video camera, a digital camera, a head mount display (goggle type display), a car navigation system, a projector, a car stereo, a personal computer, a portable information terminal (such as mobile computer, portable telephone or electronic book) and the like. Examples of these are shown in FIGS. 10A to 10F, and 11A to 11C.

Figure 10A:
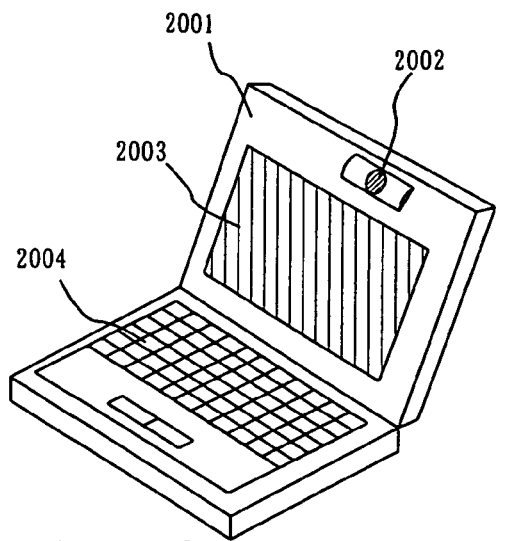
FIGS. 10A to 10F are diagrams showing an example of electronic equipments.

FIG. 10A shows a personal computer including a main body 2001, an image input portion 2002, a display portion 2003, a keyboard 2004 and the like.

Figure 10B:
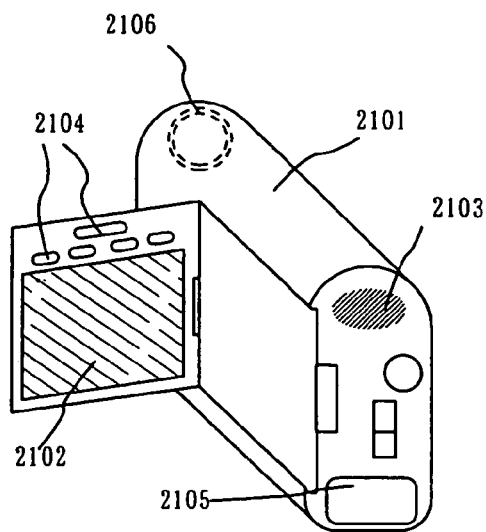

FIG. 10B shows a video camera including a main body 2101, a display portion 2102, a voice input portion 2103, operation switches 2104, a battery 2105, an image receiving portion 2106 and the like.

Figure 10C:
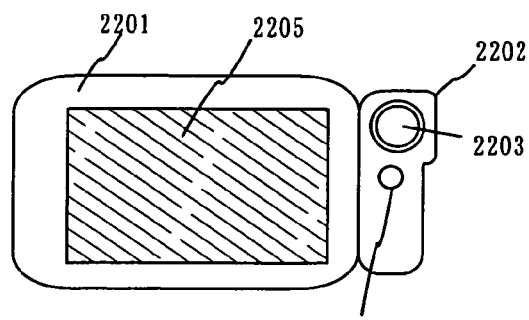

FIG. 10C shows a mobile computer including a main body 2201, a camera portion 2202, an image receiving portion 2203, an operation switch 2204, a display portion 2205 and the like.

Figure 10D:
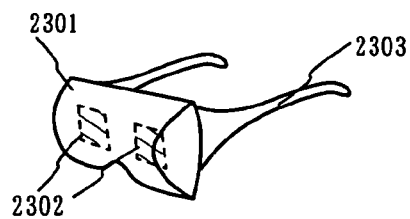

FIG. 10D shows a goggle type display including a main body 2301, a display portion 2302, an arm portion 2303 and the like.

Figure 10E:
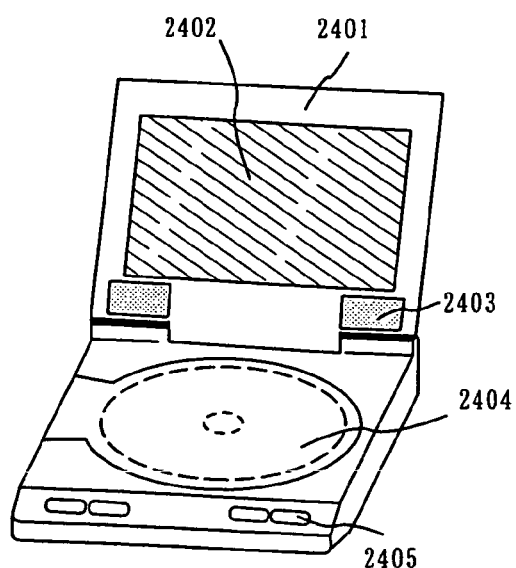

FIG. 10E shows a player using a record medium recorded with programs (hereinafter, referred to as record medium) including a main body 2401, a display portion 2402, a speaker portion 2403, a record medium 2404, an operation switch 2405 and the like. The player uses DVD (Digital Versatile Disc), CD and the like as the record medium and can enjoy music, enjoy movie and carry out games or Internet.

Figure 10F:
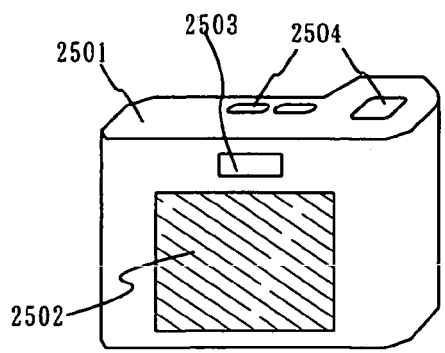

FIG. 10F shows a digital camera including a main body 2501, a display portion 2502, an eye contact portion 2503, operation switches 2504, an image receiving portion (not illustrated) and the like.

Figure 11A:
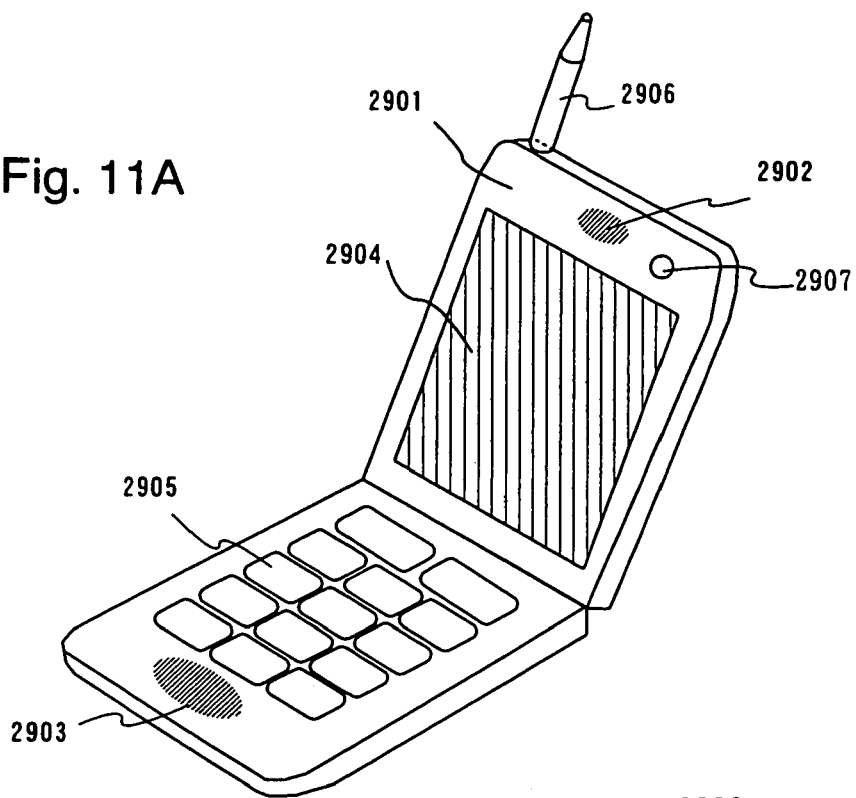
FIGS. 11A to 11C are diagrams showing an example of electronic equipments.

FIG. 11A shows a portable telephone including a main body 2901, a sound output portion 2902, a sound input portion 2903, a display portion 2904, an operation switch 2905, an antenna 2906, an image input portion (CCD, image sensor or the like) 2907 and the like.

Figure 11B:
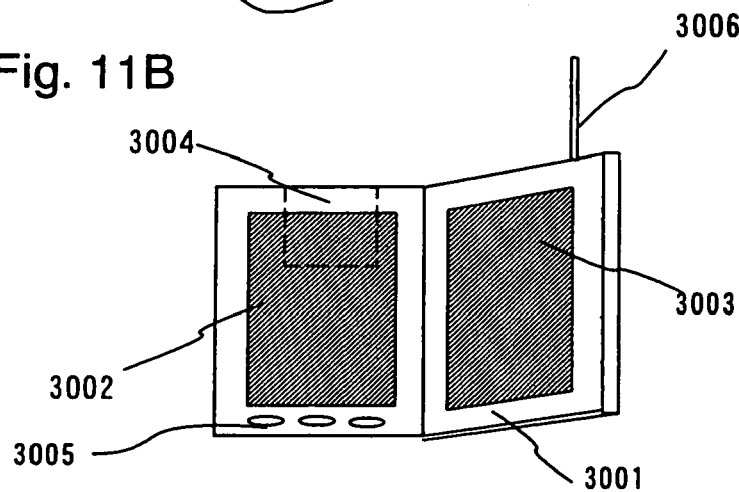

FIG. 11B shows a portable book (electronic book) including a main body 3001, display portion 3002, 3003, a record medium 3004, an operation switch 3005, an antenna 3006 and the like.

Figure 11C:
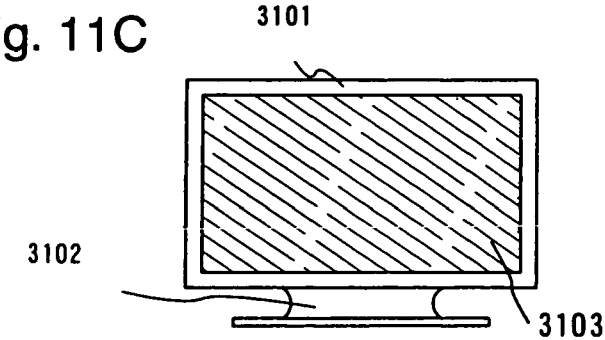

FIG. 11C shows a display including a main body 3101, a support base 3102, a display portion 3103 and the like.

Note that, the display shown in FIG. 11C is small and medium type or large type, for example, a screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic apparatuses of various fields. The electronic apparatus of the present invention can be implemented by freely combined with the structures in Embodiments 1 to 5.

The present invention can provide a light emitting device which is capable of suppressing deterioration due to diffusion of impurities such as moisture, oxygen, an alkaline metal and an alkaline earth metal. In addition, in the case where a barrier film (a $AlN_XO_Y$ film or a layer denoted by $Al_XN_Y$) having high thermal conductivity is formed on a circular polarizing plate, the present invention provides such advantages that heat developed in the element is spread so as to suppress the deterioration of the element, and transformation and degeneration of a circular polarizing film are protected while functions of a circular polarizing means are maintained.

What is claimed is:

1. An electronic apparatus comprising:
   a first adhesive layer over a substrate;
   a thin film transistor over the adhesive layer;
   a first electrode over the thin film transistor;
   a layer containing an organic compound over the first electrode;
   a second electrode over the layer containing an organic compound;
   a first insulating film comprising $AlN_XO_Y$ over the second electrode;
   a second adhesive layer over the insulating film; and
   a supporting body over the second adhesive layer, wherein the supporting body comprises a circular polarizing plate having at least a layer comprising $AlN_XO_Y$ and at least two of barrier films composed of $AlN_XO_Y$ layers and/or $Al_XN_Y$ layers and/or $Al_2O_3$ layers and a stress relaxing film being interposed between at least two of the barrier films.

2. An electronic apparatus comprising:
   a first insulating film over a substrate;
   a first adhesive layer over the first insulating film;
   a thin film transistor over the adhesive layer;
   a first electrode over the thin film transistor;
   a layer containing an organic compound over the first electrode;
   a second electrode over the layer containing an organic compound;
   a second insulating film comprising $AlN_XO_Y$ over the second electrode;
   a second adhesive layer over the second insulating film; and
   a supporting body over the second adhesive layer, wherein the supporting body comprises a circular polarizing plate having at least a layer comprising $AlN_XO_Y$ and at least two of barrier films composed of $AlN_XO_Y$ layers and/or $Al_XN_Y$ layers and/or $Al_2O_3$ layers and a stress relaxing film being interposed between at least two of the barrier films.

3. An electronic apparatus comprising:
   a thin film transistor over a substrate;
   a first insulating film over the thin film transistor;
   a first electrode over the first insulating film and connected to the thin film transistor through a hole formed in the first insulating film;
   a layer containing an organic compound over the first electrode;
   a second electrode over the layer containing an organic compound;
   a second insulating film comprising $AlN_XO_Y$ over the second electrode; and
   a supporting body over the second insulating film, wherein the supporting body comprises a circular polarizing plate having at least a layer comprising $AlN_XO_Y$ and at least two of barrier films composed of $AlN_XO_Y$ layers and/or $Al_XN_Y$ layers and/or $Al_2O_3$ layers and a stress relaxing film being interposed between at least two of the barrier films.

4. An electronic apparatus comprising:
   at least one first insulating film comprising $AlN_XO_Y$ over a substrate;
   a thin film transistor over the at least one first insulating film;
   a second insulating film over the thin film transistor;
   a first electrode over the second insulating film and connected to the thin film transistor through a hole formed in the second insulating film;
   a layer containing an organic compound over the first electrode;
   a second electrode over the layer containing an organic compound;
   a third insulating film comprising $AlN_XO_Y$ over the second electrode; and
   a supporting body over the third insulating film, wherein the supporting body comprises a circular polarizing plate having at least a layer comprising $AlN_XO_Y$ and at least two of barrier films composed of $AlN_XO_Y$ layers and/or $Al_XN_Y$ layers and/or $Al_2O_3$ layers and a stress relaxing film being interposed between at least two of the barrier films.

5. An electronic apparatus comprising:
   a thin film transistor over a substrate;
   a first insulating film over the thin film transistor;
   a first electrode over the first insulating film and connected to the thin film transistor through a hole formed in the first insulating film;
   a layer containing an organic compound over the first electrode;
   a second electrode over the layer containing an organic compound;
   a second insulating film comprising $AlN_XO_Y$ over the second electrode;
   a supporting body over the second insulating film, wherein the supporting body comprises a circular polarizing plate having at least a layer comprising $AlN_XO_Y$ and at least two of barrier films composed of $AlN_XO_Y$ layers and/or $Al_XN_Y$ layers and/or $Al_2O_3$ layers and a stress relaxing film being interposed between at least two of the barrier films; and
   an air gap provided between the second insulating film and the supporting body.

6. An electronic apparatus comprising:
   at least one first insulating film comprising $AlN_XO_Y$ over a substrate;
   a thin film transistor over the at least one first insulating film;
   a second insulating film over the thin film transistor;
   a first electrode over the second insulating film and connected to the thin film transistor through a hole formed in the second insulating film;
   a layer containing an organic compound over the first electrode;
   a second electrode over the layer containing an organic compound;
   a third insulating film comprising $AlN_XO_Y$ over the second electrode;
   a supporting body over the second insulating film, wherein the supporting body comprises a circular polarizing plate having at least a layer comprising $AlN_XO_Y$ and at least two of barrier films composed of $AlN_XO_Y$ layers and/or Al$_X$N$_Y$ layers and/or Al$_2$O$_3$ layers and a stress relaxing film being interposed between at least two of the barrier films; and an air gap provided between the second insulating film and the supporting body.

7. An electronic apparatus according to claim 1, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

8. An electronic apparatus according to claim 2, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

9. An electronic apparatus according to claim 3, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

10. An electronic apparatus according to claim 4, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

11. An electronic apparatus according to claim 5, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

12. An electronic apparatus according to claim 6, wherein the substrate is a plastic film substrate comprising a material selected from the group consisting of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR) and polybutylene terephthalate (PBT).

13. An electronic apparatus according to claim 1, wherein the electronic apparatus is one selected from the group consisting of a video camera, a digital camera, a goggle-type display, a car navigation system, a personal computer, and a portable information terminal.

14. An electronic apparatus according to claim 2, wherein the electronic apparatus is one selected from the group consisting of a video camera, a digital camera, a goggle-type display, a car navigation system, a personal computer, and a portable information terminal.

15. An electronic apparatus according to claim 3, wherein the electronic apparatus is one selected from the group consisting of a video camera, a digital camera, a goggle-type display, a car navigation system, a personal computer, and a portable information terminal.

16. An electronic apparatus according to claim 4, wherein the electronic apparatus is one selected from the group consisting of a video camera, a digital camera, a goggle-type display, a car navigation system, a personal computer, and a portable information terminal.

17. An electronic apparatus according to claim 5, wherein the electronic apparatus is one selected from the group consisting of a video camera, a digital camera, a goggle-type display, a car navigation system, a personal computer, and a portable information terminal.

18. An electronic apparatus according to claim 6, wherein the electronic apparatus is one selected from the group consisting of a video camera, a digital camera, a goggle-type display, a car navigation system, a personal computer, and a portable information terminal.

19. An electronic apparatus according to claim 1, wherein the total thickness of the layer comprising AlN$_X$O$_Y$ is 50 to 500 nm.

20. An electronic apparatus according to claim 2, wherein the total thickness of the layer comprising AlN$_X$O$_Y$ is 50 to 500 nm.

21. An electronic apparatus according to claim 3, wherein the total thickness of the layer comprising AlN$_X$O$_Y$ is 50 to 500 nm.

22. An electronic apparatus according to claim 4, wherein the total thickness of the layer comprising AlN$_X$O$_Y$ is 50 to 500 nm.

23. An electronic apparatus according to claim 5, wherein the total thickness of the layer comprising AlN$_X$O$_Y$ is 50 to 500 nm.

24. An electronic apparatus according to claim 6, wherein the total thickness of the layer comprising AlN$_X$O$_Y$ is 50 to 500 nm.

25. An electronic apparatus according to claim 1, wherein the layer comprising AlN$_X$O$_Y$ contains 2.5 to 47.5 atm% of nitrogen.

26. An electronic apparatus according to claim 2, wherein the layer comprising AlN$_X$O$_Y$ contains 2.5 to 47.5 atm% of nitrogen.

27. An electronic apparatus according to claim 3, wherein the layer comprising AlN$_X$O$_Y$ contains 2.5 to 47.5 atm% of nitrogen.

28. An electronic apparatus according to claim 4, wherein the layer comprising AlN$_X$O$_Y$ contains 2.5 to 47.5 atm% of nitrogen.

29. An electronic apparatus according to claim 5, wherein the layer comprising AlN$_X$O$_Y$ contains 2.5 to 47.5 atm% of nitrogen.

30. An electronic apparatus according to claim 6, wherein the layer comprising AlN$_X$O$_Y$ contains 2.5 to 47.5 atm% of nitrogen.

31. An electronic apparatus according to claim 1, wherein the layer containing an organic compound generates luminescence by applying an electric field.

32. An electronic apparatus according to claim 2, wherein the layer containing an organic compound generates luminescence by applying an electric field.

33. An electronic apparatus according to claim 3, wherein the layer containing an organic compound generates luminescence by applying an electric field.

34. An electronic apparatus according to claim 4, wherein the layer containing an organic compound generates luminescence by applying an electric field.

35. An electronic apparatus according to claim 5, wherein the layer containing an organic compound generates luminescence by applying an electric field.

36. An electronic apparatus according to claim 6, wherein the layer containing an organic compound generates luminescence by applying an electric field.

37. An electronic apparatus according to claim 1, further comprising:
a second insulating film over the supporting body.

38. An electronic apparatus according to claim 2, further comprising:

a second insulating film over the supporting body.

39. An electronic apparatus according to claim 3, further comprising:

a second insulating film over the supporting body.

40. An electronic apparatus according to claim 4, further comprising:

a second insulating film over the supporting body.

41. An electronic apparatus according to claim 5, further comprising:

a second insulating film over the supporting body.

42. An electronic apparatus according to claim 6, further comprising:

a second insulating film over the supporting body.

43. An electronic apparatus according to claim 1, further comprising:

wherein the first insulating film comprising $AlN_XO_Y$ covers the thin film transistor and the layer containing the organic compound.

44. An electronic apparatus according to claim 2, further comprising:

wherein the second insulating film comprising $AlN_XO_Y$ covers the thin film transistor and the layer containing the organic compound.

45. An electronic apparatus according to claim 3, further comprising:

wherein the second insulating film comprising $AlN_XO_Y$ covers the thin film transistor and the layer containing the organic compound.

46. An electronic apparatus according to claim 4, further comprising:

wherein the third insulating film comprising $AlN_XO_Y$ covers the thin film transistor and the layer containing the organic compound.

47. An electronic apparatus according to claim 5, further comprising:

wherein the second insulating film comprising $AlN_XO_Y$ covers the thin film transistor and the layer containing the organic compound.

48. An electronic apparatus according to claim 6, further comprising:

wherein the third insulating film comprising $AlN_XO_Y$ covers the thin film transistor and the layer containing the organic compound.

* * * * *